United States Patent
Ishii

(10) Patent No.: US 7,385,674 B2
(45) Date of Patent: Jun. 10, 2008

(54) EXPOSURE APPARATUS AND DEVICE MANUFACTURING METHOD

(75) Inventor: Yuuki Ishii, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/270,548

(22) Filed: Nov. 10, 2005

(65) Prior Publication Data

US 2006/0061747 A1    Mar. 23, 2006

Related U.S. Application Data

(63) Continuation of application No. PCT/JP2004/006853, filed on May 14, 2004.

(30) Foreign Application Priority Data

May 15, 2003   (JP)   ............................... 2003-137214

(51) Int. Cl.
  G03B 27/42   (2006.01)
  G03B 27/52   (2006.01)
  G03B 27/58   (2006.01)
(52) U.S. Cl. ............................. 355/53; 355/30; 355/72
(58) Field of Classification Search ................. 355/53, 355/67, 72, 75, 30
  See application file for complete search history.

(56) References Cited

U.S. PATENT DOCUMENTS

| 4,346,164 A | | 8/1982 | Tabarelli et al. |
| 4,480,910 A | * | 11/1984 | Takanashi et al. ............ 355/30 |
| 4,861,162 A | | 8/1989 | Ina |
| 5,528,118 A | | 6/1996 | Lee |
| 5,610,683 A | * | 3/1997 | Takahashi ..................... 355/53 |
| 5,623,853 A | | 4/1997 | Novak et al. |
| 5,715,039 A | | 2/1998 | Fukuda et al. |
| 5,825,043 A | | 10/1998 | Suwa |
| 5,825,470 A | * | 10/1998 | Miyai et al. .................. 355/72 |
| 5,874,820 A | | 2/1999 | Lee |
| 6,262,796 B1 | | 7/2001 | Loopstra et al. |
| 6,341,007 B1 | | 1/2002 | Nishi et al. |
| 2002/0000240 A1 | | 1/2002 | Kamikawa |
| 2002/0063856 A1 | * | 5/2002 | Inoue .......................... 355/53 |
| 2002/0163629 A1 | | 11/2002 | Switkes et al. |

(Continued)

FOREIGN PATENT DOCUMENTS

| DE | 221563 A1 | 4/1985 |
| DE | 224448 A1 | 7/1985 |
| EP | 0 605 103 A1 | 7/1994 |
| EP | 0 834 773 A2 | 4/1998 |
| EP | 1 420 302 A1 | 5/2004 |

(Continued)

OTHER PUBLICATIONS

B.J. Lin, Proceedings of SPEI vol. 4688 (2002), pp. 11-24.

(Continued)

*Primary Examiner*—Henry Hung Nguyen
(74) *Attorney, Agent, or Firm*—Oliff & Berridge, PLC

(57) ABSTRACT

An exposure apparatus in which by filling at least a portion between a projection optical system and a substrate with a liquid and by projecting an image of a pattern onto the substrate via said projection optical system and said liquid, said substrate is exposed, said exposure apparatus includes: a substrate holding member that holds said substrate and keeps liquid so that said substrate is immersed in the liquid; and a liquid supply mechanism that supplies, at a vicinity of the projection area of said projection optical system, liquid onto said substrate from above said substrate.

54 Claims, 12 Drawing Sheets

U.S. PATENT DOCUMENTS

| | | |
|---|---|---|
| 2003/0030916 A1 | 2/2003 | Suenaga |
| 2003/0169409 A1 | 9/2003 | Nishi |
| 2003/0174408 A1 | 9/2003 | Rostalski et al. |
| 2004/0000627 A1 | 1/2004 | Schuster |
| 2004/0075895 A1* | 4/2004 | Lin .............................. 359/380 |
| 2004/0103950 A1* | 6/2004 | Iriguchi ........................ 141/2 |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0007569 A1 | 1/2005 | Streefkerk et al. |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219489 A1 | 10/2005 | Nei et al. |
| 2005/0219499 A1 | 10/2005 | Zaal et al. |
| 2005/0225735 A1 | 10/2005 | Magome et al. |
| 2005/0225737 A1 | 10/2005 | Weissenrieder et al. |
| 2005/0231694 A1* | 10/2005 | Kolesnychenko et al. .... 355/53 |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0270505 A1 | 12/2005 | Smith |

FOREIGN PATENT DOCUMENTS

| | | |
|---|---|---|
| JP | A-57-153433 | 9/1982 |
| JP | A 57-153433 | 9/1982 |
| JP | A 58-202448 | 11/1983 |
| JP | A-58-202448 | 11/1983 |
| JP | A-59-19912 | 2/1984 |
| JP | A 59-019912 | 2/1984 |
| JP | A 62-065326 | 3/1987 |
| JP | A-62-65326 | 3/1987 |
| JP | A-63-157419 | 6/1988 |
| JP | A 63-157419 | 6/1988 |
| JP | A 04-305915 | 10/1992 |
| JP | A-04-305915 | 10/1992 |
| JP | A-04-305917 | 10/1992 |
| JP | A 04-305917 | 10/1992 |
| JP | A 05-62877 | 3/1993 |
| JP | A-05-62877 | 3/1993 |
| JP | A 06-124873 | 5/1994 |
| JP | A 06-168866 | 6/1994 |
| JP | A-07-220990 | 8/1995 |
| JP | A 07-220990 | 8/1995 |
| JP | A 08-166475 | 6/1996 |
| JP | A 08-316125 | 11/1996 |
| JP | A 08-330224 | 12/1996 |
| JP | A 10-163099 | 6/1998 |
| JP | A 10-214783 | 8/1998 |
| JP | A 10-303114 | 11/1998 |
| JP | A-10-303114 | 11/1998 |
| JP | A-10-340846 | 12/1998 |
| JP | A 10-340846 | 12/1998 |
| JP | A 11-176727 | 7/1999 |
| JP | A-11-176727 | 7/1999 |
| JP | A 2000-58436 | 2/2000 |
| JP | A-2000-58436 | 2/2000 |
| JP | A-2000-82737 | 3/2000 |
| JP | A 2000-511704 | 9/2000 |
| WO | WO 98/40791 | 9/1998 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/001432 A2 | 1/2005 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |

| | | | |
|---|---|---|---|
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111722 A2 | 11/2005 |

OTHER PUBLICATIONS

M. Switkes, et al., "Resolution Enhancement of 157nm Lithography by liquid immersion" Proceedings of SPEI vol. 4691 (2002), pp. 459-465.

M. Switkes, et al., "Resolution Enhancement of 157nm Lithography by liquid immersion" J. Microlith., Microfab., Microsyst., vol. 1 No. 3, Oct. 2002, pp. 1-4.

Soichi Owa et al., "Nikon F2 Exposure Tool" slides 1-25, 3$^{rd}$ 157nm symposium 2002, Sep. 4, 2002.

Soichi Owa, "Immersion Lithography" slides 1-25, Immersion Lithography Workshop, Dec. 11, 2002.

Soichi Owa and Hiroyuki Nagasaka, "Immersion lithography: its potential performance and issues," SPIE Optical Microlithography, vol. 5040(2003) p. 724-733.

Soichi Owa and Hiroyuki Nagasaka, "Potential performance and feasibility of immersion lithography" slides 1-33, NGL Workshop 2003, Jul. 10, 2003.

S. Owa et al., "Update on 193nm immersion exposure tool" slides 1-38, Immersion Workshop 2004, Jan. 27, 2004.

S. Owa et al., "Update on 193nm immersion exposure tool" slides 1-38, Litho Forum, Jan. 28, 2004.

* cited by examiner

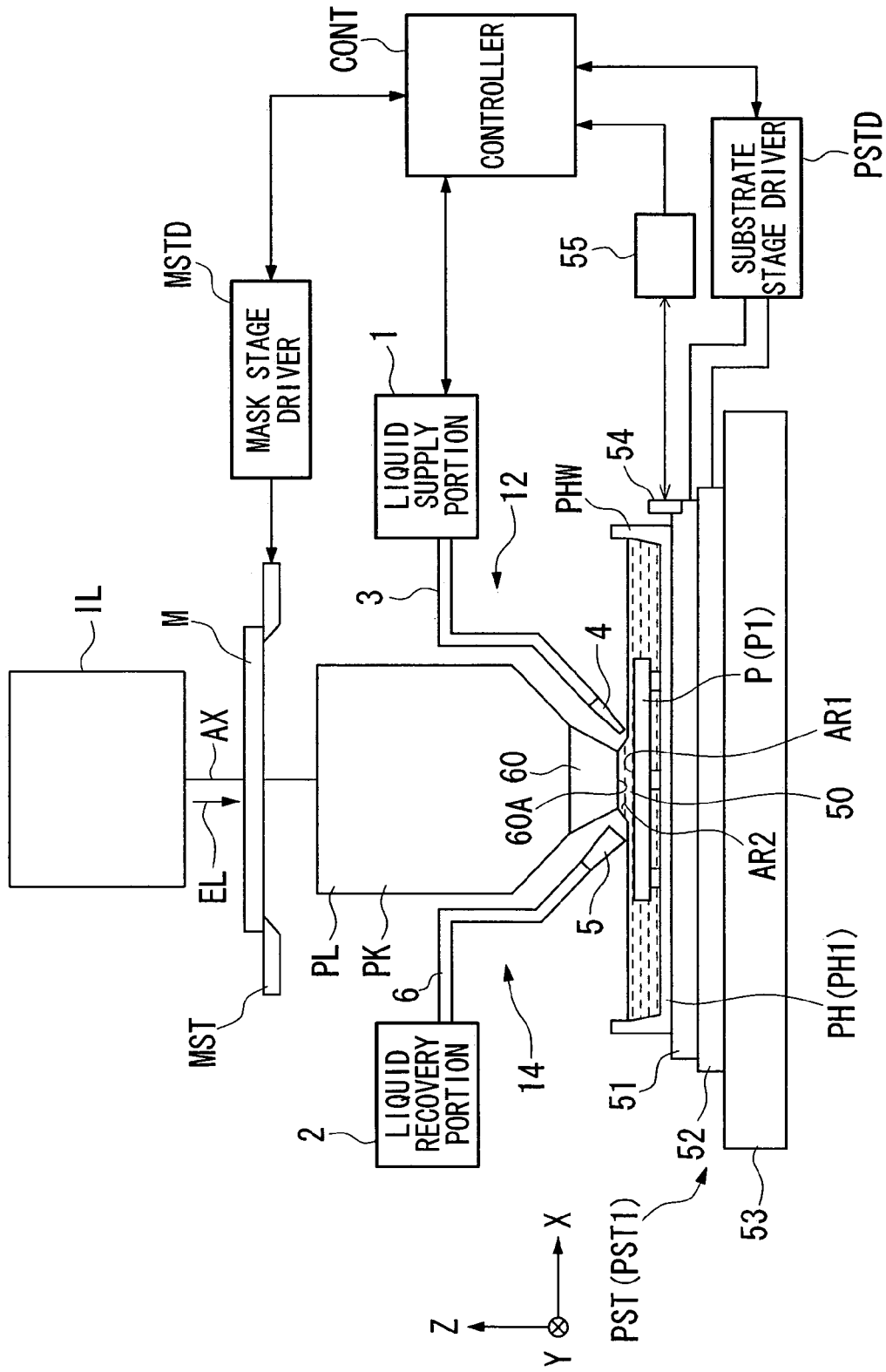

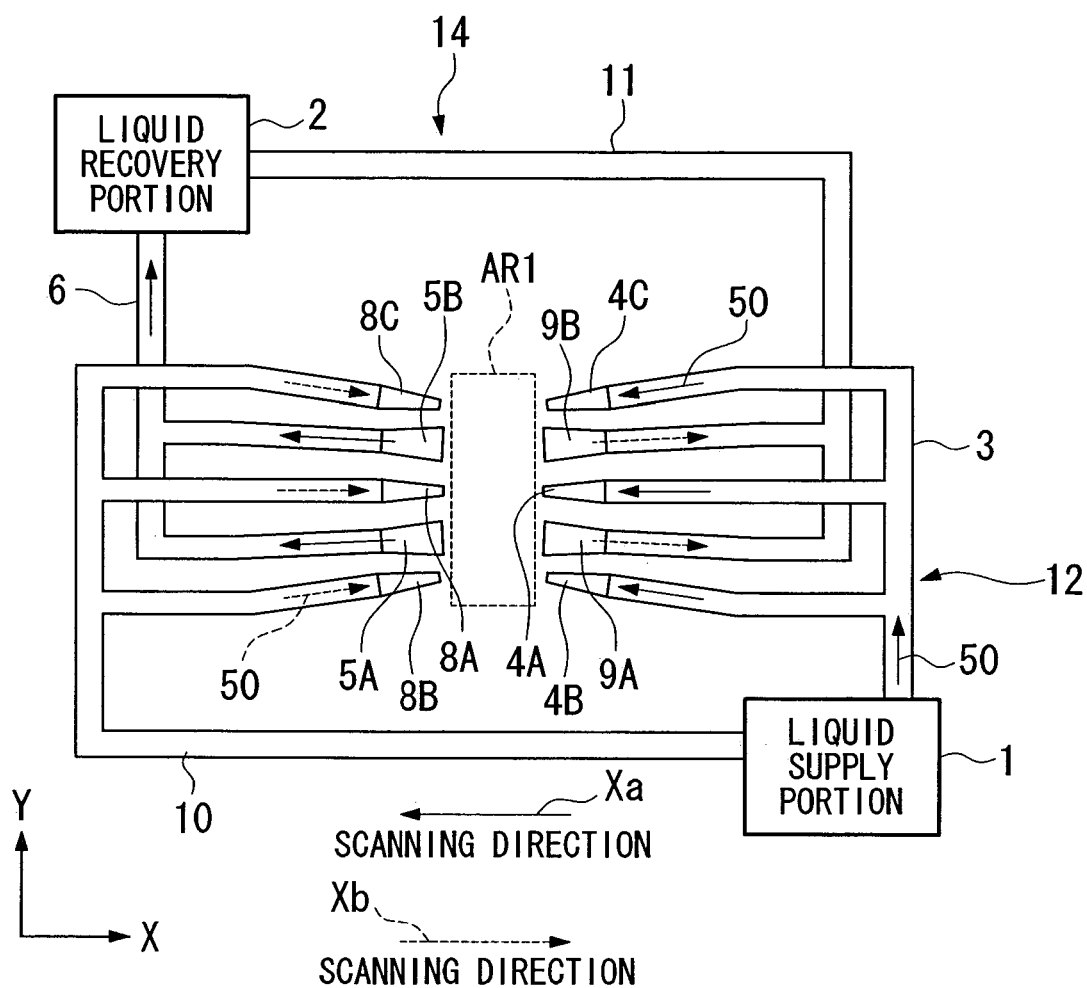

EXPOSURE APPARATUS AND DEVICE MANUFACTURING METHOD

CROSS-REFERENCE TO RELATED APPLICATION

This is a Continuation Application of International Application No. PCT/JP2004/006853, filed May 14, 2004, which claims priority to Japanese Patent Application No. 2003-137214, filed May 15, 2003. The contents of the aforementioned applications are incorporated herein by reference.

BACKGROUND OF THE INVENTION

1. Field of the Invention

The present invention relates to an exposure apparatus in which with at least a portion between a projection optical system and a substrate being filled with a liquid, a pattern is exposed onto the substrate via the projection optical system and the liquid, and to a device manufacturing method that uses the exposure apparatus.

2. Description of Related Art

Semiconductor devices and liquid crystal display devices are manufactured through the so-called photolithography technique, by which a pattern formed on a mask is transferred onto a photosensitive substrate. The exposure apparatus used in the photolithography process has a mask stage that supports the mask and a substrate stage that supports the substrate, and while successively moving the mask stage and the substrate stage, transfers the mask pattern, via a projection optical system, onto the substrate. In recent years, to address the increasingly high integration of device patterns, increasingly high resolution of the projection optical system has been desired. The shorter the exposure wavelength used is, and, also, the larger the numerical aperture of the projection optical system is, the higher the resolution of the projection optical system becomes. For this reason, the exposure wavelength used for the exposure apparatus is becoming shorter and shorter year by year, and the numerical aperture of the projection optical system is also becoming larger and larger. In this context, the presently dominant exposure wavelength is 248 nm from a KrF excimer laser, but a still shorter wavelength of 193 nm from an ArF excimer laser is now gradually being put to practical use. In addition, when performing exposure, the depth of focus (DOF) is an important factor along with the resolution. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. To address this problem, the liquid immersion method, which is disclosed in, e.g., below-described patent documents 1 and 2, has been proposed as a method to make the exposure wavelength shorter in effect and to make the depth of focus broader. This liquid immersion method is designed, by filling the space between the under surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and enlarge the depth of focus by approximately n times.

By the way, with respect to the above-mentioned related art, there are problems as described below.

The exposure apparatus disclosed in the PCT International Publication No. WO 99/49504 is configured such that a liquid is supplied and recovered so that a liquid immersion region is formed on a part of a substrate; however, when the liquid is not completely recovered and remains on the substrate, there is the possibility that the remaining liquid vaporizes, thereby the substrate thermally deforms and, after vaporizing, an adhesion trace (so-called water mark) remains on the substrate and adversely affects the pattern to be formed on the substrate. On the other hand, the exposure apparatus disclosed in Japanese Unexamined Patent Application, First Publication No. H10-303114 is configured such that the entirety of a substrate is held in a liquid; however, because the liquid between the projection optical system and the substrate is not replaced so much, there is the possibility that the temperature of the liquid of the liquid immersion region may change and impurities are apt to be contained therein, which may deteriorates the pattern image projected onto the substrate. Thus, there arises the possibility that devices having a desired performance cannot be manufactured.

Furthermore, with respect to the exposure apparatus of the above-mentioned PCT International Publication No. WO 99/49504, when a substrate having experienced an exposure process is conveyed (carried out), with the liquid remaining (adhering) on the surface of the substrate, the remaining liquid drops from the substrate during the conveyance process, which results, for example, the disadvantage that due to the liquid dropped, various devices and members neighboring on the conveyance path rust, or the cleanliness of the ambience in which the exposure apparatus is installed cannot be maintained. Furthermore, the liquid that has dropped (scattered) from the substrate may cause the ambient condition (humidity) change around the exposure apparatus. When the humidity changes, there arises, for example, the problem that the air on the optical path of an optical interferometer used for measuring the stage position fluctuates, the stage measurement cannot be performed accurately, and thus a desired pattern transfer accuracy cannot be obtained. Furthermore, if after the exposure process, a development process, for example, is performed in a state that the liquid still adheres on the substrate, there arises the possibility that devices having a desired performance cannot be manufactured.

SUMMARY OF THE INVENTION

The present invention has been made in consideration of such situations, and its object is to provide an exposure apparatus by which even when an exposure process is performed with a liquid being filled between a projection optical system and a substrate, a desired device pattern can be formed on the substrate, and a device manufacturing method that uses the exposure apparatus.

To resolve the above-described problems, the present invention adopts the following configurations that are illustrated in the embodiments and correspond to FIGS. 1 to 12.

An exposure apparatus of the present invention is an exposure apparatus in which by filling at least a portion between a projection optical system and a substrate with a liquid and by projecting an image of a pattern onto the substrate via the projection optical system and the liquid, the substrate is exposed, the exposure apparatus includes: a substrate holding member that holds the substrate and keeps the liquid so that the substrate is immersed in the liquid; and a liquid supply mechanism that supplies, at a vicinity of the projection area of the projection optical system, the liquid onto the substrate from above the substrate.

In accordance with the present invention, because it is configured such that a liquid is supplied from above the substrate in a state that the entire substrate is immersed in the liquid, the influence of the vaporization of the liquid on the substrate surface, specifically, e.g., the thermal deformation of the substrate and the emergence of an adhesion trace due to the liquid vaporization, can be prevented, and because a fresh and clean liquid can be supplied between the projection optical system and the substrate, the influences of the liquid temperature change and of impurities being suppressed, thereby a desired pattern can be formed on the substrate. Thus, devices having a desired performance can be manufactured.

An exposure apparatus of the present invention is an exposure apparatus in which by forming a liquid immersion region on at least a part of a substrate and by projecting an image of a pattern onto the substrate via the liquid forming the liquid immersion region and a projection optical system, the substrate is exposed, the exposure apparatus includes a substrate holding member that holds the substrate and has a side wall portion formed such that it surrounds the substrate to prevent the liquid flowing out; and a movable member on which the substrate holding member can be detachably set and which is two-dimensionally movable relative to the projection optical system while supporting the substrate holding member.

In accordance with the present invention, by detachably setting the substrate holding member on the movable member, the substrate having experienced an exposure process can be carried out in a state that the substrate is held by the substrate holding member. Accordingly, the ambient condition change, the rusting of the devices, etc., caused by the dropping or scattering of the liquid from the substrate can be prevented.

An exposure apparatus of the present invention is an exposure apparatus in which by forming a liquid immersion region on at least a part of a substrate and by projecting an image of a pattern onto the substrate via a liquid forming the liquid immersion region and a projection optical system, the substrate is exposed, the exposure apparatus includes: a substrate holding member that holds the substrate, with a movable member on which the substrate holding member can be detachably set and which is two-dimensionally movable relative to the projection optical system while supporting the substrate holding member; and a conveyance mechanism that conveys the substrate holding member detached from the movable member, with the substrate held by the substrate holding member.

In accordance with the present invention, because by detachably setting the substrate holding member on the movable member, a substrate having experienced an exposure process can be carried out in a state that the substrate is held by the substrate holding member, the adhesion and residual of the liquid on the movable member or the members near the movable member can be prevented, and, for example, the dropping of the liquid from the substrate can be prevented.

A device manufacturing method of the present invention uses the exposure apparatuses described above. In accordance with the present invention, devices having a desired performance can be manufactured in a state that the influence of the vaporization of the liquid and the ambient condition change are suppressed.

BRIEF DESCRIPTION OF THE DRAWINGS

FIG. 1 is viewed from above.

FIG. 3 is a schematic diagram showing an embodiment of an exposure apparatus main body that performs exposure processes.

FIG. 6 is a drawing showing a layout example of supply nozzles and recovery nozzles.

DETAILED DESCRIPTION OF THE INVENTION

Figure 1:
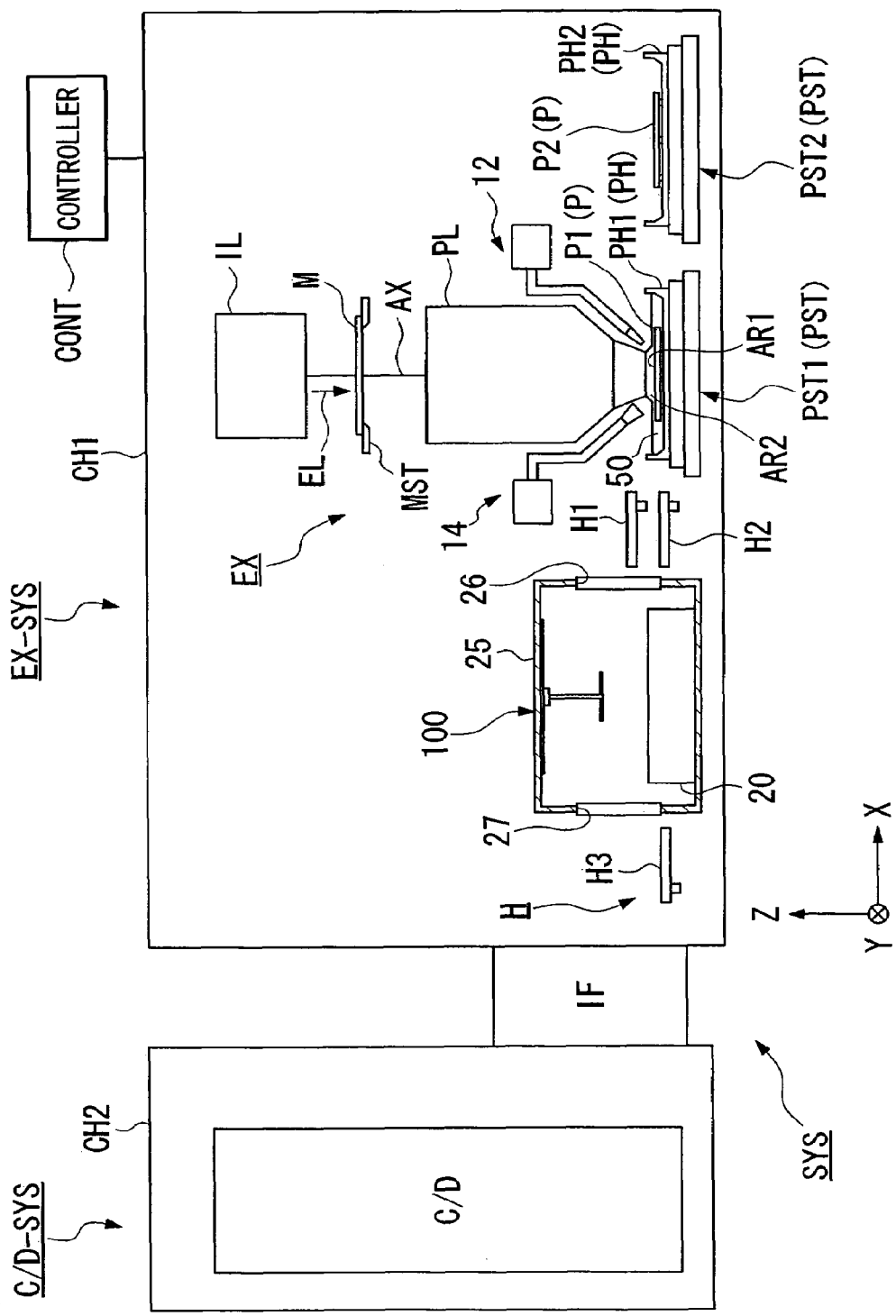
FIG. 1 is a schematic diagram showing an embodiment of a device manufacturing system as an exposure apparatus of the present invention.
Figure 2:
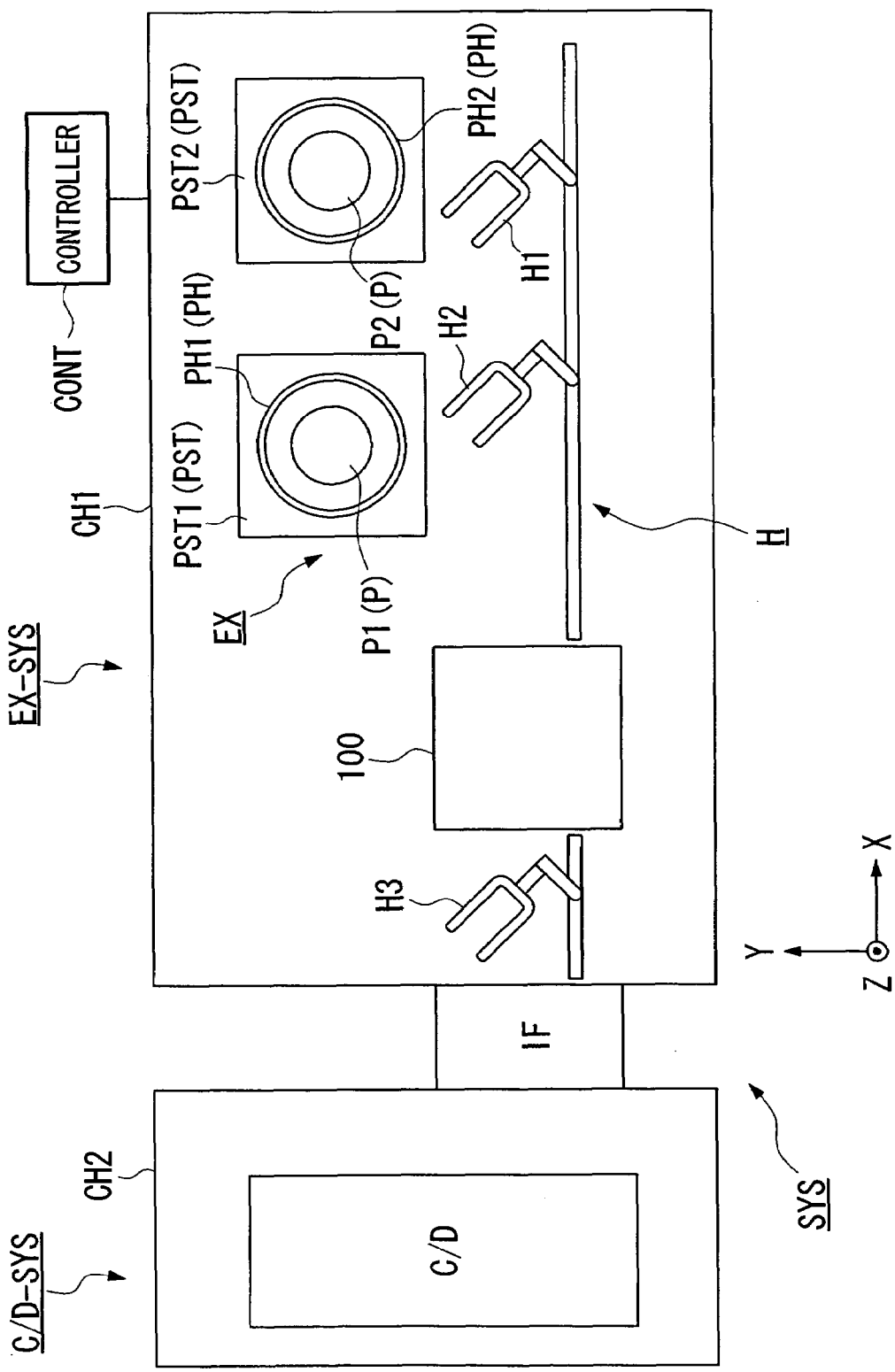
FIG. 2 is a drawing when

Now, referring to the drawings, an exposure apparatus and a device manufacturing method of the present invention will be described. FIG. 1 is a drawing showing an embodiment of a device manufacturing system provided with an exposure apparatus of the present invention and is a schematic diagram when viewed from the side; FIG. 2 is a drawing when FIG. 1 is viewed from above.

In FIGS. 1 and 2, a device manufacturing system SYS is provided with an exposure apparatus EX-SYS and a coater-developer device C/D-SYS. The exposure apparatus EX-SYS is provided with an interface portion IF that forms a connection portion thereof to the coater-developer device C/D-SYS, with an exposure apparatus main body EX that by filling a space between a projection optical system PL and a substrate P, an object to be exposed, with liquid 50 and by projecting a pattern image onto the substrate P via the projection optical system PL and the liquid 50, exposes the substrate P, with a conveyance system (a conveyance mechanism) H that can convey the substrate P between the interface portion IF and the exposure apparatus main body EX, with a liquid removal device 100 that constitutes a liquid removal mechanism which is provided midway along the conveyance path of the conveyance system H and removes the liquid adhering on the substrate P experienced an exposure process, and with a controller CONT that controls the overall operation of the exposure apparatus EX-SYS. In this embodiment, the conveyance system H is provided with first, second, and third conveyance devices H1, H2, and H3, each having an arm portion.

The exposure apparatus main body EX is located within a first chamber device CH1 in which cleanliness is controlled. The first, second, and third conveyance devices H1, H2, and H3 are also disposed within the first chamber device CH1. The coater-developer device C/D-SYS is provided with a coater device C that applies photoresist (photosensitive material) to the base material of the substrate P before the exposure process and with a development device (a processing device) D that develops the substrate P after the exposure process performed at the exposure apparatus main body EX. The coater device C and the development device D are located within the second chamber device CH2 separate from the first chamber device CH1.

The first chamber device CH1 that accommodates the exposure apparatus main body EX and the second chamber device CH2 that accommodates the coater device C and the development device D are connected to each other via the interface portion IF. Note that in the following description, the coater device C and the development device D that are accommodated in the second chamber device CH2 will be collectively referred to as "a coater-developer main body C/D" as necessary.

The exposure apparatus main body EX is a liquid immersion type exposure apparatus in which an exposure is performed in a state that a space between the projection optical system PL and the substrate P is filled with liquid 50, i.e., in a state that a liquid immersion region AR2 is formed on the substrate P. The exposure apparatus main body EX is provided with a mask stage MST that supports a mask M, with a substrate holder PH (PH1, PH2) that constitutes a substrate holding member that holds the substrate P (P1, P2), with a substrate stage PST (PST1, PST2) that constitutes a movable member that holds the substrate holder PH and moves the substrate holder PH, with an illumination optical system IL that illuminates the mask M supported by the mask stage MST with exposure light EL, with the projection optical system PL that projects an image of a pattern of the mask M illuminated with the exposure light EL onto the substrate P held by the substrate holder PH on the substrate stage PST, with a liquid supply mechanism 12 that supplies, at a vicinity of a projection area AR1 of the projection optical system PL, the liquid 50 for forming the liquid immersion region AR2 on the substrate P from above the substrate P, and with a liquid recovery mechanism 14 that recovers, at a vicinity of the projection area AR1, the liquid 50 on the substrate P.

It should be noted here that as will be described later, the substrate holder PH is detachably set on the substrate stage PST, and the conveyance system H (the first, second, and third conveyance devices H1, H2, and H3) can convey not only the substrate P, but also the substrate holder PH having the substrate P being held thereby.

The exposure apparatus main body EX of the embodiment adopts a so-called twin stage system having the two substrate stages PST1 and PST2. As a specific configuration of the twin stage system, such a system as is disclosed in, e.g., Japanese Unexamined Patent Application, First Publication No. H10-163099, Japanese Unexamined Patent Application, First Publication No. H10-214783, or Published Japanese Translation No. 2000-511704 of the PCT International Publication may be adopted. In FIG. 1, the first substrate stage PST1 supports the first substrate holder PH1 that holds the first substrate P1, and the second substrate stage PST2 supports the second substrate holder PH2 that holds the second substrate P2.

Furthermore, the exposure apparatus main body EX of the embodiment is a scan type exposure apparatus (the so-called scanning stepper) in which while synchronously moving the mask M and the substrate P in mutually different directions (opposite directions) along the scanning direction, the pattern formed on the mask M is exposed onto the substrate P. In the following description, it is assumed that the synchronous movement direction (the scanning direction), in a horizontal plane, of the mask M and the substrate P is referred to as the X-axis direction, that the direction perpendicular to the X-axis direction, in the horizontal plane, is referred to as the Y-axis direction (the non-scanning direction), and that the direction that is perpendicular to the X-axis direction and to the Y-axis direction and coincides with the optical axis AX of the projection optical system PL is referred to as the Z-axis direction. Furthermore, it is assumed that the direction around the X-axis, the direction around the Y-axis, and the direction around the Z-axis are respectively referred to as the θX-direction, the θY-direction, and the θZ-direction. It should be noted that a "substrate" referred to herein comprehends a semiconductor wafer over which photoresist is applied and that a "mask" comprehends a reticle on which a device pattern to be reduction projected onto a substrate is formed.

FIG. 3 is a schematic diagram of the exposure apparatus main body EX and is a drawing showing the state in which the first substrate stage PST1, among the first substrate stage PST1 and the second substrate stage PST2, is positioned under the projection optical system PL. Note that the second substrate stage PST2 has a configuration equivalent to that of the first substrate stage PST1 and that the second substrate holder PH2 has a configuration equivalent to that of the first substrate holder PH1.

The illumination optical system IL is for illuminating the mask M supported by the mask stage MST with the exposure light EL and includes a exposure light source, an optical integrator for uniforming the illuminance of a light flux emitted from the exposure light source, a condenser lens for condensing the exposure light EL from the optical integrator, a relay lens system, a variable field stop for setting an illumination area on the mask M formed by the exposure light EL to be of a slit-like shape, etc. The illumination area on the mask M is illuminated, by the illumination optical system IL, with the exposure light EL having a uniform illuminance distribution. As the exposure light EL emitted from the illumination optical system IL, for example, a bright line of ultraviolet region (g-line, h-line, i-line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ laser light (wavelength of 157 μm) may be used. In the embodiment, an ArF excimer laser light is used.

The mask stage MST is for supporting the mask M, is two-dimensionally movable in a plane perpendicular to the optical axis AX, i.e., in the XY-plane, and is finely rotatable in the θZ-direction. The mask stage MST is driven by a mask stage driver MSTD such as a linear motor. The mask stage driver MSTD is controlled by the controller CONT. The two-dimensional position and the rotation angle of the mask M on the mask stage MST are measured by a laser interferometer in real time, and the measurement results are outputted to the controller CONT. By driving the mask stage driver MSTD based on the measurement results from the laser interferometer, the controller CONT performs positioning of the mask M supported by the mask stage MST.

The projection optical system PL is for projection exposing the pattern of the mask M onto the substrate P at a predetermined projection magnification of β and is constituted by a plurality of optical elements (lenses), and those optical elements are supported by a lens barrel PK as a metal member. In the embodiment, the projection optical system PL is a reduction system of which the projection magnification β is, e.g., ¼ or ⅕. It should be noted that the projection optical system PL may also be either a unit magnification system or a magnifying system. Furthermore, at the end side (the substrate P's side) of the projection optical system PL of the embodiment, an optical element (lens) 60 protrudes from the lens barrel PK. The optical element 60 is detachably (exchangeably) disposed relative to the lens barrel PK.

The substrate stage PST (PST1) moves while supporting the substrate holder PH (PH1), which is capable of holding the substrate P, and provided with a Z stage 51 that supports the substrate holder PH, a XY stage 52 that supports the Z stage 51, and a base 53 that supports the XY stage 52. Furthermore, the substrate stage PST (the Z stage 51 and the XY stage 52) is driven by a substrate stage driver PSTD such as a linear motor. The substrate stage driver PSTD is controlled by the controller CONT. By driving the Z stage 51 of the substrate stage PST, the Z-direction position (focus position) and the θX- and θY-direction positions of the substrate P held by the Z stage 51 are controlled. Furthermore, by driving the XY stage 52 of the substrate stage PST, the XY-direction position (the position in the direction substantially parallel to the image plane of the projection optical system PL) of the substrate P is controlled. More specifically, the substrate stage PST is movable at least two-dimensionally relative to the projection optical system PL; the Z stage 51, by controlling the focus position and inclination angle of the substrate P, makes the surface of the substrate P to coincide with the image plane of the projection optical system PL in an auto-focus manner and an auto-leveling manner; and, the XY stage 52 performs positioning of the substrate P in the X-axis and Y-axis directions. It is to be noted that needless to say, the Z stage and the XY stage may be integrally constructed. Still further, on the substrate stage PST (the Z stage 51) is set a moving mirror 54, and at a position facing the moving mirror 54 is positioned a laser interferometer 55. The two-dimensional position and the rotation angle of the substrate P on the substrate stage PST are measured by the laser interferometer 55 in real time, and the measurement results are outputted to the controller CONT. By driving the substrate stage driver PSTD based on the measurement results from the laser interferometer 55, the controller CONT performs positioning of the substrate P supported by the substrate stage PST.

The substrate holder PH (PH1) is for holding the substrate P (P1) and has a side wall portion PHW formed such that it surrounds the substrate P to prevent flowing out of the liquid 50 having been supplied on the substrate P by a liquid supply mechanism 12. The substrate holder PH is capable of keeping a predetermined amount of liquid by the side wall portion PHW and keeps the liquid 50 in the inside region of the side wall portion PHW such that the substrate P held is immersed in the liquid 50. At least during an exposure process, the substrate P is held in the liquid inside of the side wall portion PHW of the substrate holder PH.

The substrate holder PH (PH1) is detachably set on the substrate stage PST (PST1). More specifically, it is configured such that the substrate holder PH can be attached and detached relative to the substrate stage PST in a state that the substrate P is held by the substrate holder. Here, as described above, the exposure apparatus main body EX of the embodiment adopts a twin stage system; it is configured such that as the substrate stage PST, the first substrate stage PST1 and the second substrate stage PST2 are provided; and it is configured such that as the substrate holder PH, the multiple substrate holders PH1 and PH2 are provided. Furthermore, each of the substrate holders PH1 and PH2 can be attached to and detached from either of the first substrate stage PST1 and the second substrate stage PST2.

Figure 4A:
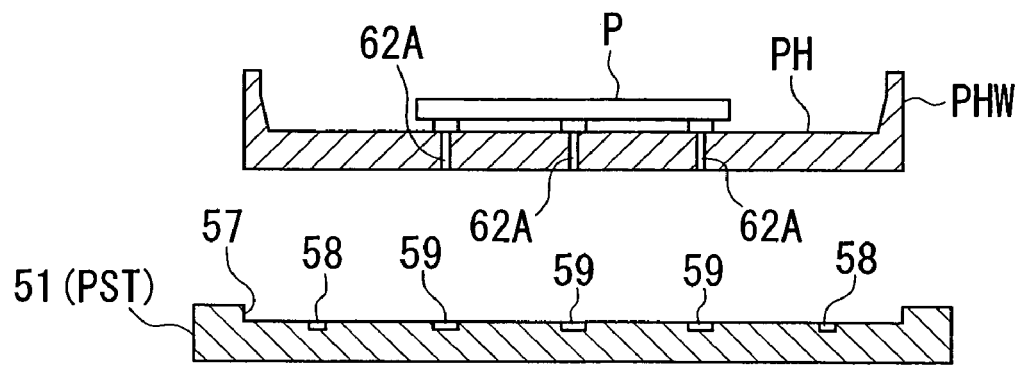
FIGS. 4A and 4B are diagrammatic sketches to explain a substrate holder that is attached and detached relative to a substrate stage.
Figure 4B:
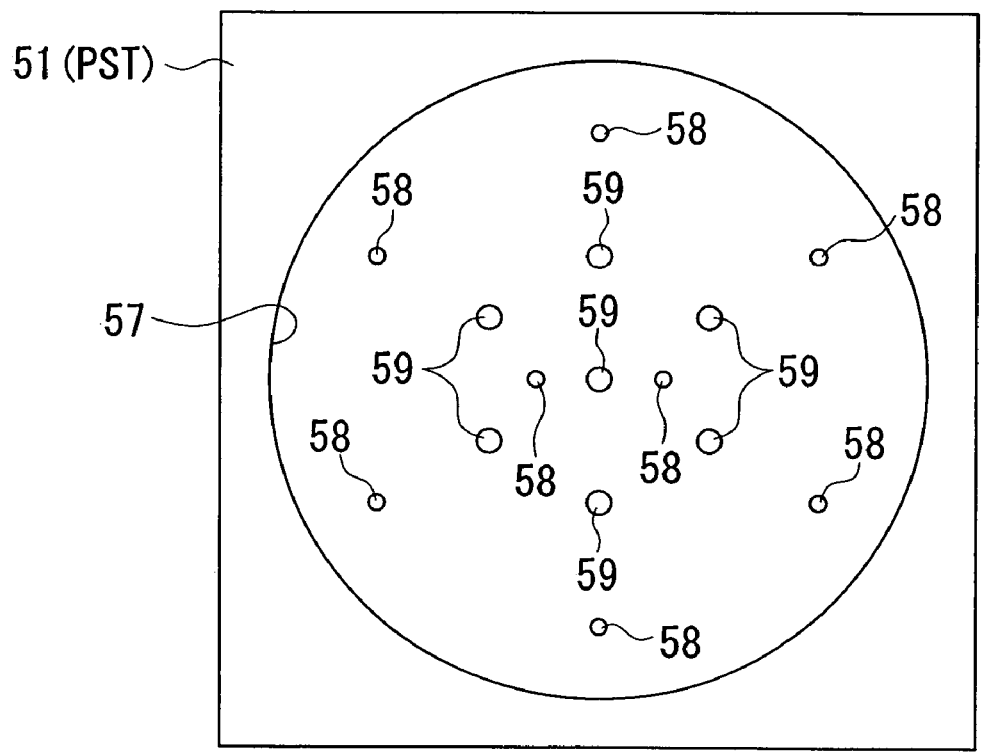

FIGS. 4A and 4B are drawings showing the substrate holder PH that is attached to and detached from the substrate stage PST (the Z stage 51). FIG. 4A is a sectional side view; FIG. 4B is a plan view of 51 when viewed from above after the substrate holder PH has been detached from the Z stage.

As shown in FIGS. 4A and 4B, the Z stage 51 is provided, on its upper surface (the surface for holding the substrate holder PH), with a concave portion 57 in which the substrate holder PH can be fitted and with a plurality of vacuum suction holes 58 that are provided inside of the concave portion 57 and suck-and-hold the substrate holder PH positioned in the concave portion 57. By fitting the substrate holder PH in the concave portion 57, the Z stage 51 and the substrate holder PH are aligned with each other. The vacuum suction holes 58 constitute a portion of a chucking mechanism that holds the substrate holder PH positioned in the concave portion 57 and are connected to a vacuum device, not shown. The drive of the vacuum device is controlled by the controller CONT. The controller CONT controls the vacuum device to perform, via the vacuum suction holes 58, the suction-and-hold and release-of-hold operations of the Z stage 51 on the substrate holder PH. By performing the release-of-hold operation, the substrate holder PH becomes separable from the Z stage 51.

It should be noted that while it is described in the above that the Z stage 51 vacuum suck-and-holds the substrate holder PH, it may also be configured such that the substrate holder PH is held and from-hold-released by means of another chucking mechanism such as an electromagnetic chucking mechanism. Furthermore, while it is described in the above that the alignment between the Z stage 51 and the substrate holder PH is performed by using the concave portion 57, it may also be configured, for example, such that the positional relationship between the substrate holder PH and the Z stage 51 is optically detected, and then based on the detection results, the substrate holder PH is positioned in a predetermined position relative to the Z stage 51.

The conveyance system H provided with the conveyance devices (see FIG. 1) can convey the substrate holder PH detached from the substrate stage 51. For example, the second conveyance device H2 of the conveyance system H can carry out (unload), from the substrate stage PST, the substrate holder PH holding the substrate P that has experienced an exposure process and then convey it to a liquid removal device 100. Furthermore, the first conveyance device H1 can carry (load) the substrate holder PH holding the substrate P that has not yet experienced an exposure process to the substrate stage PST.

Figure 5A:
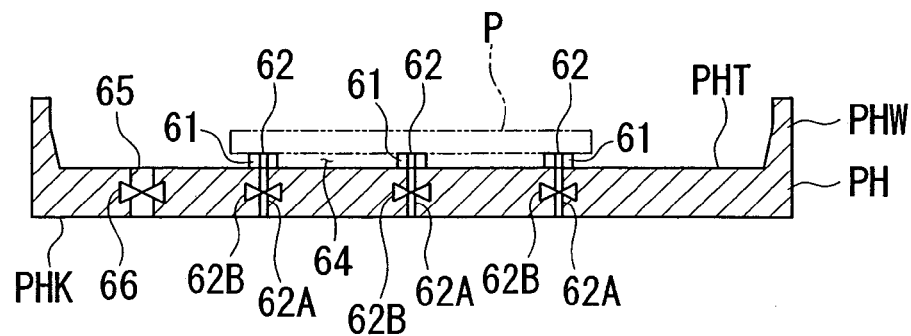
FIGS. 5A and 5B are drawings showing an embodiment of a substrate holder.
Figure 5B:
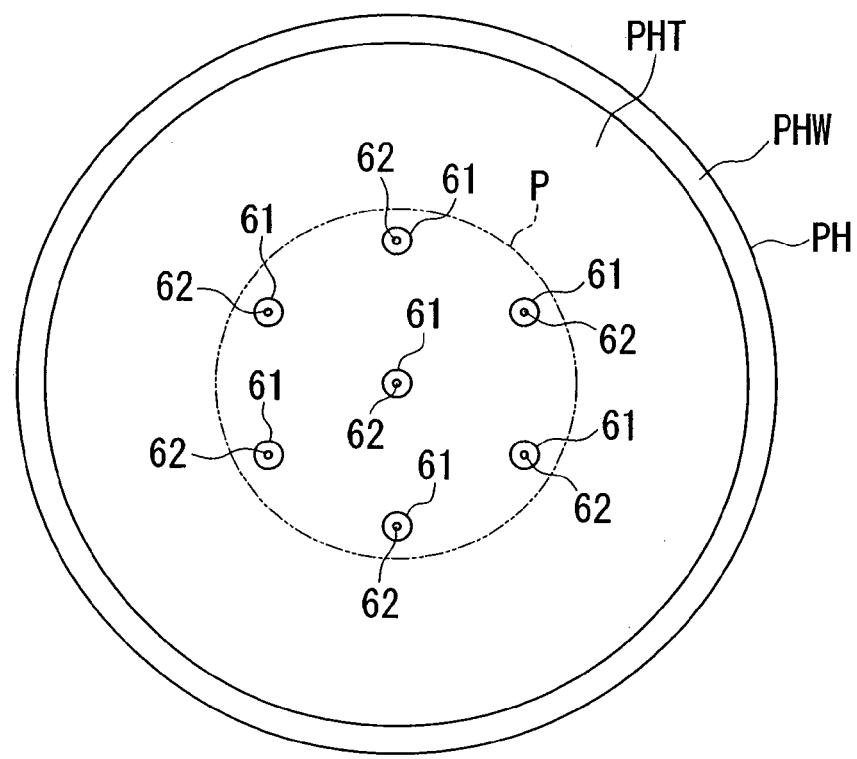

FIGS. 5A and 5B are drawings showing the substrate holder PH; FIG. 5A is a sectional side view; FIG. 5B is a plan view, when viewed from above.

In FIGS. 5A and 5B, the substrate holder PH is provided with the above-described side wall portion PHW that can keep the liquid 50, with a plurality of convex portions 61 formed on a bottom surface portion PHT, and with vacuum suction holes 62 formed on the upper end surfaces of the convex portions 61. The upper end surfaces of the convex portions 61 are flat surfaces; and the substrate holder PH supports the substrate P by the upper end surfaces of the multiple convex portions 61 and, suck-and-holds the substrate P via the vacuum suction holes 62. Here, each of the convex portions 61 is formed in each of a plurality of predetermined positions on the bottom surface portion PHT of the substrate holder PH so that the substrate P supported does not bend. With the substrate P being supported by the convex portions 61, a space portion 64 is formed between the substrate P and the bottom surface portion PHT of the substrate holder PH. It is to be noted that while in the embodiment, the substrate holder PH is substantially disc-shaped, when viewed from the top, it may also be rectangle-shaped.

Furthermore, it is configured such that when the Z stage 51 and the substrate holder PH are connected, the vacuum suction holes 62 of the substrate holder PH are connected, via flow paths 62A formed in the substrate holder PH, to flow paths 59 (see FIG. 4B, etc.) provided on the upper surface of the Z stage 51. The flow paths 59 are connected to the vacuum device, and the controller CONT drives the vacuum device to suck-and-holds the substrate P supported by the convex portions 61, via the flow paths 59 of the Z stage 51, the flow paths 62A of the substrate holder PH, and the vacuum suction holes 62. Here, each of the flow paths 62A is provided with valve portion 62B which is constituted by, among other things, an electromagnetic that is driven under the control of the controller CONT, and thus the open/close operations of the flow paths 62A can be remote controlled. The controller CONT, when it drives the vacuum device, opens the flow paths 62A by controlling the valve portions 62B; and, the controller, when it stops the vacuum device, closes the flow paths 62A. Thus, it is configured such that by stopping the drive of the vacuum device and by, at the same time, closing the flow paths 62A by means of the valve portions 62B after the suction operation on the substrate P via the vacuum suction holes 62, the negative pressure of the flow paths 62A is maintained. Accordingly, even when the Z stage 51 and the substrate holder PH are separated from each other, the substrate holder PH can, with the negative pressure of the flow paths 62A being kept, maintain the suction-and-hold of the substrate P.

Furthermore, at a predetermined position of the bottom surface portion PHT of the substrate holder PH are provided a flow path 65 that can discharge the liquid 50 held by the substrate holder PH and a valve portion 66 which is constituted by, among other things, an electromagnetic valve that opens and closes the flow path 65. The drive of the valve portion 66 is controlled by the controller CONT. The flow path 65 is formed such that it runs completely from the substrate holder PH's bottom surface portion PHT to the under surface PHK.

Returning to FIG. 3, the liquid supply mechanism 12 is provided with a liquid supply portion 1 that can deliver the liquid, with a supply pipe 3 of which one end portion is connected to the liquid supply portion 1, and with a supply nozzle 4 that is connected to the other end portion of the supply pipe 3 and is provided in the vicinity of the projection area AR1. The liquid supply portion 1 is provided with a tank that stores the liquid 50, a pressurizing pump, a filter device that can remove impurities contained in the liquid to be supplied, etc.; and thus, the liquid supply portion 1 can deliver the liquid from which the impurities have been removed. The liquid supply mechanism 12 supplies, via the supply pipe 3 and the supply nozzle 4, the liquid 50 delivered from the liquid supply portion 1, at a vicinity of the projection area AR1 of the projection optical system PL, from above the substrate P to fill at least the space between the end surface of the projection optical system PL (the end surface of the lens 60) and the substrate P with the liquid.

The liquid recovery mechanism 14 is provided with a liquid recovery portion 2 provided with a suction pump, a tank that stores the liquid recovered, etc., with a recovery pipe 6 of which one end portion is connected to the liquid recovery portion 2, and with a recovery nozzle 5 that is connected to the other end portion of the recovery pipe 6 and is positioned in the vicinity of the projection area AR1. The liquid recovery mechanism 14 drives the liquid recovery portion 2 and recovers, at a vicinity of the projection area AR1 of the projection optical system PL, the liquid on the substrate P via the recovery nozzle 5 and the recovery pipe 6.

In order to fill the space between the projection optical system PL and the substrate P with liquid 50 during the exposure of the substrate P, the controller CONT drives the liquid supply portion 1 to supply, via the supply pipe 3 and the supply nozzle 4, the liquid of a predetermined amount on the substrate P per-unit-time and, at the same time, drives the liquid recovery portion 2 to recover, via the recovery nozzle 5 and the recovery pipe 6, the liquid of the predetermined amount off from the substrate P per-unit-time. By this, the liquid immersion region AR2 is formed between the projection optical system PL and the substrate P.

With respect to the undermost lens 60 of the projection optical system PL, its end portion 60A is formed to be of a rectangular shape elongated in the Y-direction (non-scanning direction), with only a portion required in the scanning direction being left. During scanning exposure, a pattern image of a part of the mask M is projected onto the rectangular projection area AR1 beneath the end portion 60A, and in synchronization with the movement of the mask M in the −X direction (or in the +X direction) at a speed V, the substrate P moves relative to the projection optical system PL, via the XY stage 52, in the +X direction (or in the −X direction) at a speed $\beta \cdot V$ ($\beta$ is the projection magnification). After completion of exposure of one shot area, a next shot area is brought to a scanning start position through the stepping movement of the substrate P, and in this way, exposure for each shot area is successively performed through the step-and-scan method. In addition, during the exposure of a shot area, the liquid flows, relative to the projection optical system PL, in the same direction as the moving direction of the substrate P.

FIG. 6 is a drawing illustrating the relationship among the projection area AR1 of the projection optical system PL, the supply nozzle 4 (4A-4C) that supplies the liquid 50 in the x-direction, and the recovery nozzle 5 (5A, 5B) that recovers the liquid 50. In FIG. 6, the projection area AR1 is of a rectangle shape elongated in the Y-direction; three supply nozzles 4A-4C are disposed in the +X direction side and two recovery nozzles 5A and 5B are disposed in the −X direction side so that the projection area AR1 is located between the three supply nozzles and the two recovery nozzles. The supply nozzles 4A-4C are connected to the liquid supply portion 1 via the supply pipe 3, and the recovery nozzles 5A and 5B are connected to the liquid recovery portion 2 via the recovery pipe 6. Furthermore, supply nozzles 8A-8C and recovery nozzles 9A and 9B are disposed in the arrangement in which the supply nozzles 4A-4C and the recovery nozzles 5A and 5B are rotated by substantially 180 degrees. The supply nozzles 4A-4C and the recovery nozzles 9A and 9B are disposed alternately in the Y-direction; the supply nozzles 8A-8C and the recovery nozzles 5A and 5B are disposed alternately in the Y-direction; supply nozzles 8A-8C are connected to the liquid supply portion 1 via a supply pipe 10; the recovery nozzles 9A and 9B are connected to the liquid recovery portion 2 via a recovery pipe 11.

When, in the exposure apparatus main body EX, the scanning exposure for the substrate P is performed by moving the substrate in the scanning direction (−X direction) indicated by arrow Xa (see FIG. 6), the supply and the recovery of the liquid 50 are performed by the liquid supply device 1 and the liquid recovery device 2, by the use of the supply pipe 3, the supply nozzles 4A-4C, the recovery pipe 6, and the recovery nozzles 5A and 5B. More specifically, when the substrate P moves in the −X direction, the liquid 50 is supplied, from the liquid supply device 1, between the projection optical system PL and the substrate P via the supply pipe 3 and the supply nozzle 4 (4A-4C), and, at the same time, the liquid 50 is recovered by and into the liquid recovery device 2 via the recovery nozzle 5 (5A, 5B) and the recovery pipe 6, with the liquid 50 flowing in the −X direction such that the space between the lens 60 and the substrate P is filled with the liquid. On the other hand, when the scanning exposure for the substrate P is performed by moving the substrate in the scanning direction (+X direction) indicated by arrow Xb, the supply and the recovery of the liquid 50 are performed by the liquid supply device 1 and the liquid recovery device 2, by the use of the supply pipe 10, the supply nozzles 8A-8C, the recovery pipe 11, and the recovery nozzles 9A and 9B. More specifically, when the substrate P moves in the +X direction, the liquid 50 is supplied, from the liquid supply device 1, between the projection optical system PL and substrate P via the supply pipe 10 and the supply nozzle 8 (8A-8C), and, at the same time, the liquid 50 is recovered by and into the liquid recovery device 2 via the recovery nozzle 9 (9A, 9B) and the recovery pipe 11, with the liquid 50 flowing in the +X direction such that the space between the lens 60 and the substrate P is filled with the liquid. In this way, the controller CONT, by using the liquid supply device 1 and the liquid recovery device 2, makes the liquid 50 flow along the moving direction of the substrate P. In this regard, the liquid 50 supplied from the liquid supply device 1 via, e.g., the supply nozzle 4 flows in the manner that the liquid, being induced by the −X direction movement of the substrate P, is pulled into the space between the projection optical system PL and the substrate P, and thus, even if the supply energy of the liquid supply device 1 is small, the liquid 50 can be easily supplied to the space. By changing, in response to the scanning direction, the direction in which the liquid 50 is made to flow, the space between the end surface of the lens 60 and the substrate P can be filled with the liquid 50, in both of the case where the substrate P is scanned in the +X direction and in the case where the substrate P is scanned in the −X direction, which makes it possible to obtain a high resolution and a wide depth of focus.

Figure 7:
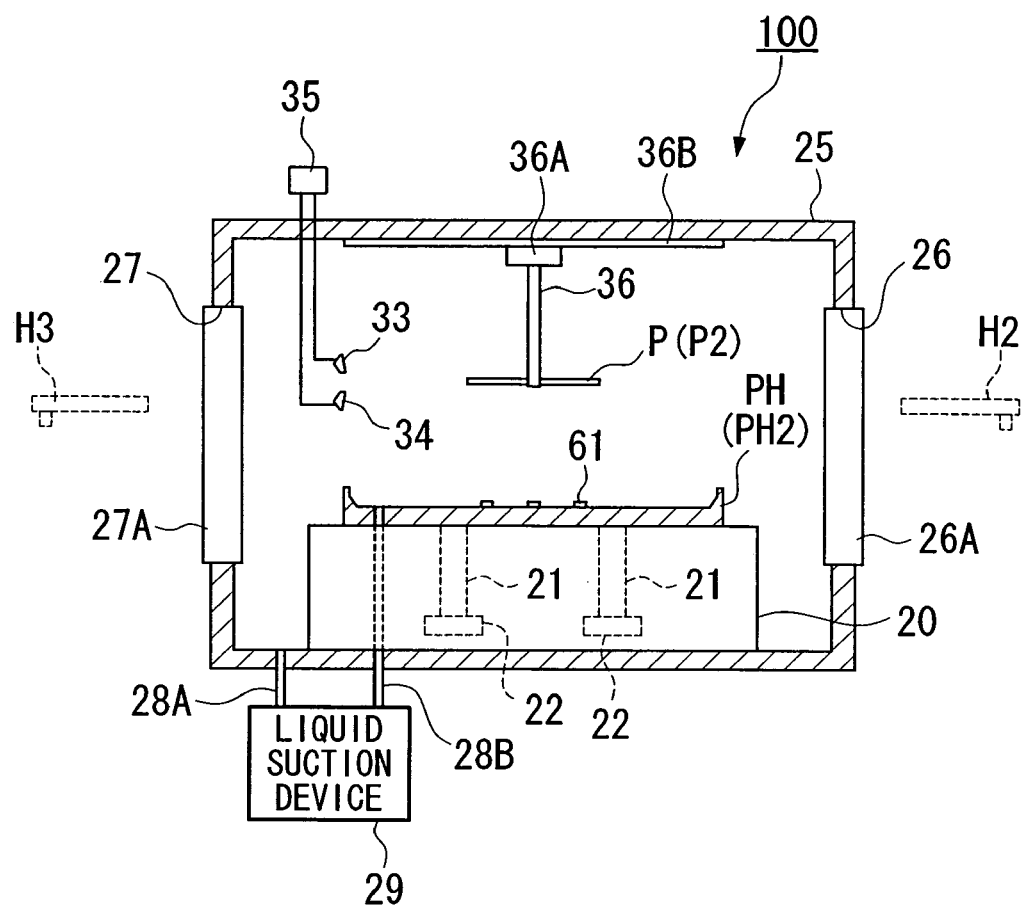
FIG. 7 is a schematic diagram showing an embodiment of a liquid removal device associated with the present invention.

Next, referring to FIG. 7, an embodiment of the liquid removal device 100 will be described. The liquid removal device 100 is provided midway along the conveyance path of the conveyance system H and is for removing the liquid adhering on the substrate P experienced a liquid immersion exposure process. As described earlier, the conveyance system H can convey the substrate holder PH along with the substrate P, and it is configured such that, for example, the second conveyance device H2 of the conveyance system H detaches and carries out (unloads) the substrate P having experienced an exposure process along with substrate holder PH from the substrate stage PST, and then conveys them to the liquid removal device 100.

The liquid removal device 100 is provided with a stage device 20, with a holder supporting members 21 that are provided to the stage device 20 and have pin members that can support the substrate holder PH having been conveyed to the liquid removal device 100 by the conveyance system H (the second conveyance device H2), with a driving mechanisms 22 that move the holder supporting members 21 up and down relative to the stage device 20, with a holding member 36 that can hold the substrate P having been conveyed along with the substrate holder PH, with a first blowing portion 33 that by blowing a gas against the surface (upper surface) of the substrate P held by the holding member 36, blows off and removes the liquid 50 adhering on the surface of the substrate P, and with a second blowing portion 34 that by blowing a gas against the reverse surface (under surface) of the substrate P held by the holding member 36, blows off and removes the liquid 50 adhering on the reverse surface of the substrate P. Being controlled by the controller CONT, the driving mechanisms 22 can, by moving the holder supporting members 21 down, mount the substrate holder PH supported by the holder supporting member 21 on the upper surface of the stage device 20 and separates, by moving the holder supporting members 21 up, the substrate holder PH from the stage device 20.

The stage device 20, the holder supporting members 21, the driving mechanisms 22, the holding member 36, the first blowing portion 33, and the second blowing portion 34 are provided inside of a chamber 25 as a cover mechanism. The chamber 25 is provided with a first opening portion 26 formed on the side of the second conveyance device H and a second opening portion 27 formed on the side of the third conveyance device H3. To the first opening portion 26 is provided a first shutter 26A that opens and closes the first opening portion 26; to second opening portion 27 is provided a second shutter 27A that opens and closes the second opening portion 27. The open/close operations of the first shutter 26A and the second shutter 27A are controlled by the controller CONT. When the first shutter 26A is opened, the second conveyance device H2 becomes accessible into the liquid removal device 100 (the chamber 25) via the first opening portion 26 and can carry (carry out) the substrate holder PH holding the substrate P into (from) the liquid removal device 100. On the other hand, the third conveyance device H3 is accessible into the liquid removal device 100 via the second opening portion 27 and can carry out the substrate P from the liquid removal device 100 (and carry the substrate P into the liquid removal device 100). Furthermore, by closing the first and second shutters 26A and 27B, the chamber 25 is made to be airtight.

Each of the first and second blowing portions 33 and 34 is connected to a gas supply device 35 via a flow path. To the flow path is provided a filter that removes the foreign substances (dust and oil mist) in the gas to be blown against the substrate P. The gas supply device 35 supplies dry gas to the first and second blowing portions 33 and 34. In the embodiment, the gas supply device 35 supplies dry air. By using the dry air supplied from the gas supply device 35, the first and second blowing portions 33 and 34 blow off the liquid adhering on the substrate P held by the holding member 36. Here, the gas blown by the first and second blowing portions 33 and 34 is blown against the surface and the reverse surface of the substrate P from an inclined direction. While moving the first and second blowing portions 33 and 34 in the X-direction relative to the substrate P held by the holding member 36, the controller CONT blows the gas. In this regard, because the length of each nozzle main body of the first and second blowing portions 33 and 34 is sufficiently large compared with the substrate P, the gas is blown all over against the upper and reverse surfaces of the substrate P. With the gas being blown against the substrate P, the liquid 50 adhering thereon is blown off and removed.

Figure 8:
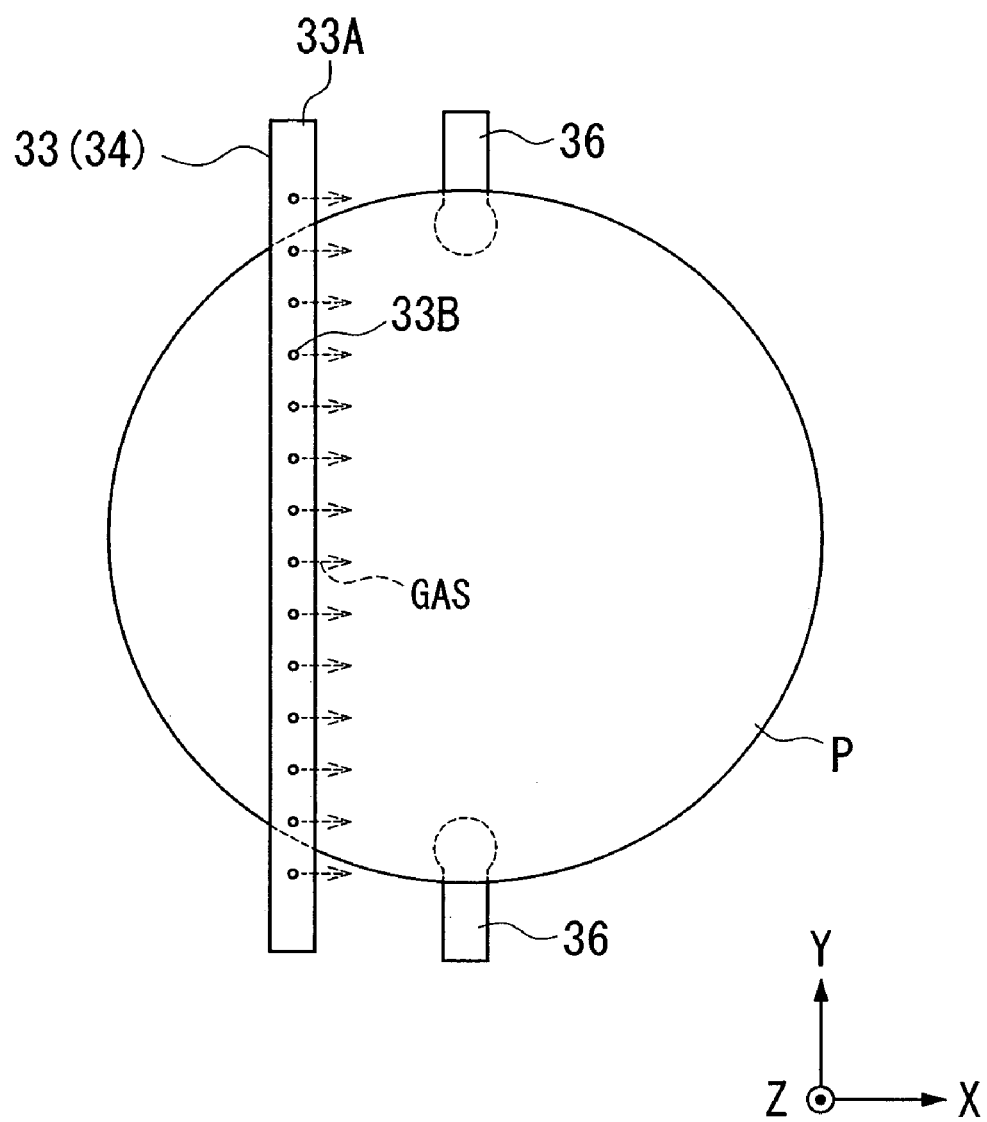
FIG. 8 is a plan view to explain the gas blowing portion in FIG. 7.

FIG. 8 is a drawing of the inside of the chamber 25, viewed from above. As shown in FIG. 8, the substrate P2 is held by the holding member 36 at both Y-axis direction end portions of the reverse surface side. The first blowing portion 33 is provided with a nozzle main body portion 33A of which longitudinal direction is directed in the Y-direction and with a plurality of nozzle holes 33B that are successively provided in the longitudinal direction of the nozzle main body portion 33A. The dry air supplied by the gas supply device 35 is blown from each of the plurality of nozzle holes 33B. The second blowing portion 34 has also a configuration equivalent to that of the first blowing portion 33, and has a nozzle main body portion of which longitudinal direction is directed in the Y-direction and a plurality of nozzle holes.

The substrate P held by the holding member 36 and the first and second blowing portions 33 and 34 are set such that they can move relative to each other. In the embodiment, it is configured such that the holding member 36 holding the substrate P2 can scan-move in the x-direction along a guide portion 36B (see FIG. 7) by the drive of a driver 36A, and, by this, it is configured such that the substrate P2 moves relative to the first and second blowing portions 33 and 34. It is to be noted that it may also be configured such that the first and second blowing portions 33 and 34 are scan-moved in the x-direction relative to the substrate P held by the holding member 36 or that both of the holding member 36 and the first and second blowing portions 33 and 34 are moved.

The liquid removal device 100 is provided with a suction pipe 28A one end of which is disposed on the bottom surface of the chamber 25 and the other end of which is connected to a liquid suction device 29 and with a suction pipe 28B one end of which is disposed on the upper surface of the stage device 20 and the other end of which is connected to the liquid suction device 29. The suction pipe 28A is for sucking the liquid 50 that has dropped on the bottom surface of the chamber 25; the suction pipe 28B is for sucking the liquid 50 that is inside of the side wall portion PHW of the substrate holder PH mounted on the stage device 20. The liquid suction device 29 has a pump, a tank that recovers the liquid sucked, etc., and sucks and recovers the liquid via the suction pipes 28A and 28B. Here, it is configured such that the one end of the suction pipe 28B is connected to the flow path 65 of the substrate holder PH being mounted on the upper surface of the stage device 20; and the suction pipe 28B and the liquid suction device 29 suck, via the flow path 65, the liquid 50 that is inside of the side wall portion PHW of the substrate holder PH.

Next, the operation of the device manufacturing system SYS provided with the above-described exposure apparatus main body EX and the liquid removal device 100 will be described.

Here, in the embodiment, a liquid immersion method is applied to, with the exposure wavelength being shortened in effect, improve the resolution and, at the same time, to widen the depth of focus in effect. For that purpose, at least while the pattern image of the mask M is being transferred onto the substrate P, the space between the surface of the substrate P and the substrate P's side end surface (under surface) of the optical element (lens) 60 of the projection optical system PL is filled with the liquid 50 to form the liquid immersion region AR2 on the substrate P. As described above, the lens 60 protrudes at the end side of the projection optical system PL, and it is configured such that the liquid 50 is in contact with only lens 60. By this, for example, rusting of a lens barrel PK made of a metal is prevented. In the embodiment, purified water is used as liquid 50. Purified water can transmit not only ArF excimer laser light, but also the exposure light EL even when it is, for example, a bright line of ultraviolet region (g-line, h-line, or i-line) emitted from a mercury lamp or deep ultraviolet light (DUV light) such as KrF excimer laser light (wavelength of 248 nm).

Furthermore, in the embodiment, the first conveyance device H1 of the conveyance system H carries (loads) substrate P that has not yet been exposed to the substrate stage PST, with the substrate being held by the substrate holder PH; the second conveyance device H2 carries out (unloads), from the substrate stage PST, substrate P that has experienced an exposure process along with the substrate holder PH and then conveys them to the liquid removal device 100; the third conveyance device H3 conveys substrate P between the liquid removal device 100 and the interface portion IF. Substrate P having been applied with a photoresist coating process at the coater-developer main body C/D (coater device C) is delivered to the third conveyance device H3 via the interface portion IF. Here, with respect to the first and second chamber devices CH1 and CH2, in each of the portions thereof that face the interface portion IF are provided an opening portion and a shutter that opens and closes the opening portion. During the conveyance operation of substrate P relative to the interface portion IF, the shutters are opened. The third conveyance device H3 mounts the substrate P before being subjected to an exposure process on the substrate holder PH at the liquid removal device 100 (or at an intermediary device or conveyance device, not shown). The first conveyance device H1 loads the substrate holder PH holding substrate P before being subjected to the exposure process onto the substrate stage PST of the exposure apparatus main body EX, specifically, onto either one of the first substrate stage PST1 and the second substrate stage PST2. Next, substrate P after being subjected to the exposure process is unloaded from the substrate stage PST along with the substrate holder PH by the second conveyance device H2. The second conveyance device H2 delivers the substrate holder PH holding the unloaded substrate P to the liquid removal device 100. The substrate P from which the liquid is removed by the liquid removal device 100 is then delivered to the third conveyance device H3, and the third conveyance device H3 delivers the substrate P to the coater-developer main body C/D (development device D) via the interface portion IF. The development device D applies the delivered substrate P with a development process.

In the following, referring to FIGS. 9A to 9C and FIGS. 10A to 10C, the operation of the device manufacturing system SYS will be described.

Figure 9A:
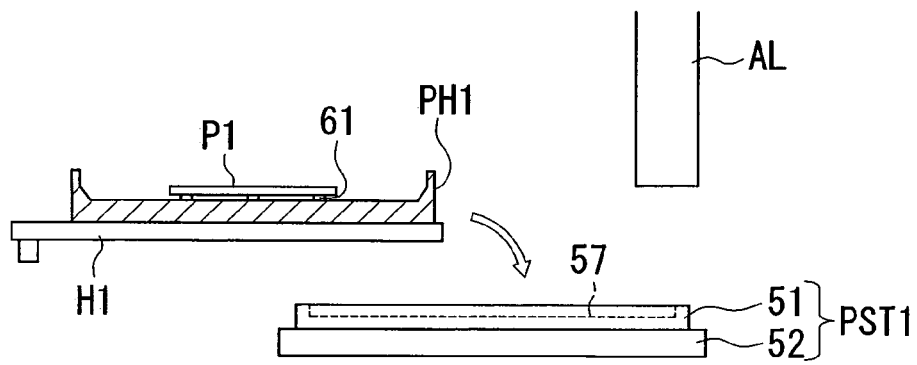
FIGS. 9A, 9B and 9C are diagrammatic sketches to explain the operation of an exposure apparatus of the present invention.
Figure 9B:
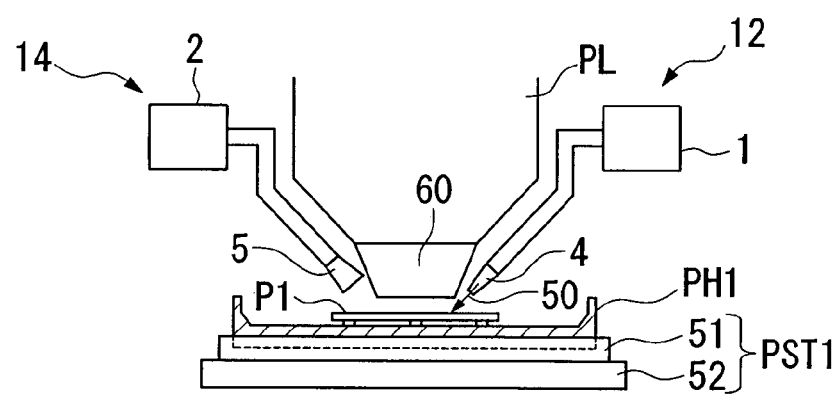

As shown in FIG. 9A, the controller CONT carries (loads), by using the first conveyance device H1, the substrate holder PH (PH1) holding the substrate P (P1) before being subjected to an exposure process onto the substrate stage PST1, one of the two substrate stages PST1 and PST2. Here, as has been described referring to FIGS. 4A and 4B, the substrate holder PH is positioned so as to fit in the concave portion 57 provided on the substrate stage PST (Z stage 51) and is held by the chucking mechanism having the vacuum suction holes 58. Then, the controller CONT drives the vacuum device to vacuum suck-and-hold the substrate P1 via the flow paths 59, the flow paths 62A, and the vacuum suction holes 62. Furthermore, under an alignment system AL, measurement of the surface position of the substrate P, detection of alignment marks on the substrate P, etc., are performed. Note that during this process, the valve portions 62B keep the flow paths 62A open. Next, the controller CONT moves the substrate stage PST1 to the position under the projection optical system PL and activates the liquid supply mechanism 12 to begin to supply the liquid 50 onto the substrate P from above the substrate P. In this process, because the vacuum suction holes 62 are closed up by the substrate P1 suck-and-held, the liquid 50 supplied does not leak into the vacuum suction holes 62.

Figure 9C:
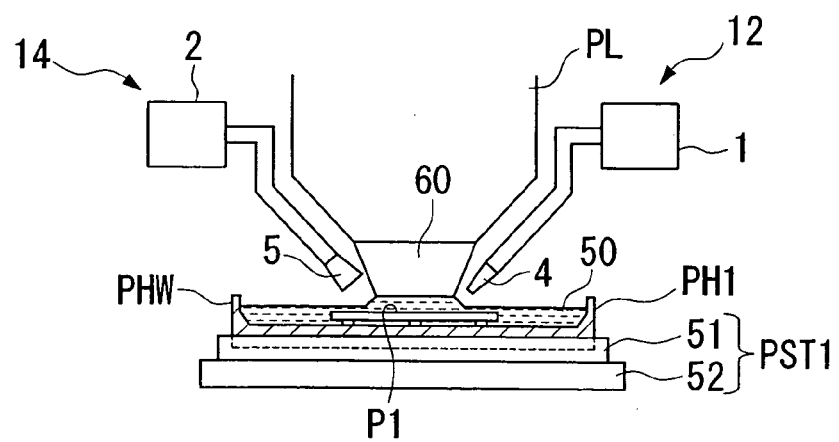

When the liquid has pooled, inside of the side wall portion PHW of the substrate holder PH1, to the extent that a thin film of the liquid (water) having a thickness of 1 mm or less is formed on the surface of the substrate P1, the controller CONT, by moving the substrate stage PST1 in the Z-direction little by little, makes the lens 60 at the end of the projection optical system PL come in contact with the liquid 50 on substrate the P1, as shown in FIG. 9C. On completion of the realization of this state, the controller CONT begins the liquid supply by means of the liquid supply mechanism 12 and the liquid recovery by means of the liquid recovery mechanism 14 to start a liquid immersion exposure process for the substrate P1. By this, the fresh liquid from which impurities have been removed is continuously supplied between the projection optical system PL and the substrate P1. Furthermore, when each shot area of the substrate P1 is exposed, the liquid (water) already supplied on the substrate P1 and the liquid supplied from the liquid supply mechanism 12 mix with each other with good affinity; and thus, a stable flow of the liquid 50 can be created between the projection optical system PL and the substrate P, even if the substrate P is moved (scanned) at a high speed. In addition, because the substrate holder PH1 is provided with the side wall portion PHW, the liquid 50 does not flow to the outside of the substrate holder PH1 during the exposure of substrate P.

It should be noted that while, in the above, the substrate stage PST1 is moved in the Z-direction after the liquid has pooled on the surface of the substrate P1, it may also be configured such that before beginning to supply the liquid 50 from the liquid supply mechanism 12, the substrate stage PST1 is moved in the Z-direction up to a predetermined position.

Figure 10A:
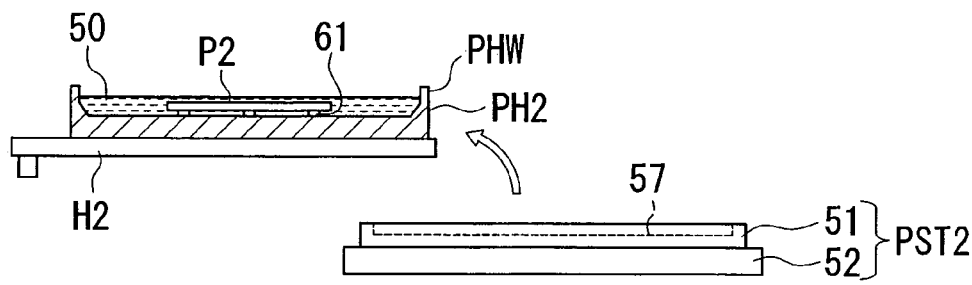
FIGS. 10A, 10B and 10C are diagrammatic sketches to explain the operation of an exposure apparatus of the present invention.

While the liquid immersion exposure is performed for the substrate P1 on the substrate holder PH1 supported by the substrate stage PST1, one of the first and second substrate stages PST1 and PST2, the controller CONT detaches the substrate holder PH2 that is supported by the other substrate stage PST2 and is holding the exposed substrate P2 and then carries out (unloads) the substrate holder PH2 from the substrate stage PST2. When detaching the substrate holder PH2 from the substrate stage PST2, the controller CONT releases the hold of the substrate holder PH2 by the chucking mechanism including the vacuum suction holes 58 and, at the same time, closes flow paths 62A by using the valve portions 62B. As shown in FIG. 10A, the controller CONT carries out (unloads) from the substrate stage PST2, by means of the second conveyance device H2, the substrate holder PH2 holding the exposed substrate P2 in liquid 50. When detaching the substrate holder PH2 from the substrate stage PST2, because, as has been described referring to FIGS. 5A and 5B, the flow paths 62A connected to the vacuum suction holes 62 suck-and-holding the substrate P2 are closed by the valve portions 62B and thus the negative pressure state of the flow paths 62A is maintained, the suction-and-hold of the substrate P2 on the upper end surfaces of the convex portions 61 is maintained, and, at the same time, the liquid 50 kept inside of the side wall portion PHW does not flow out via the flow paths 62A. Needless to say, during the liquid immersion exposure and conveyance processes, the flow path 65 of the substrate holder PH2 is closed by the valve portion 66.

The second conveyance device H2, after detaching the substrate holder PH2 holding the substrate P2 from substrate stage PST2, conveys the substrate holder PH2 to the liquid removal device 100. When the second conveyance device H2 approaches the liquid removal device 100, the controller CONT opens the first shutter 26A. During this process, the second shutter 27A is closed. The second conveyance device H2 delivers, via the first opening portion 26, the substrate holder PH2 to the holder supporting members 21 of the liquid removal device 100. During this process, the holder supporting members 21 are, based on the drive of the driving mechanisms 22, elevated relative to the stage device 20, and the second conveyance device H2 delivers the substrate holder PH2 to the holder supporting members 21 that are elevated relative to the stage device 20.

Figure 10B:
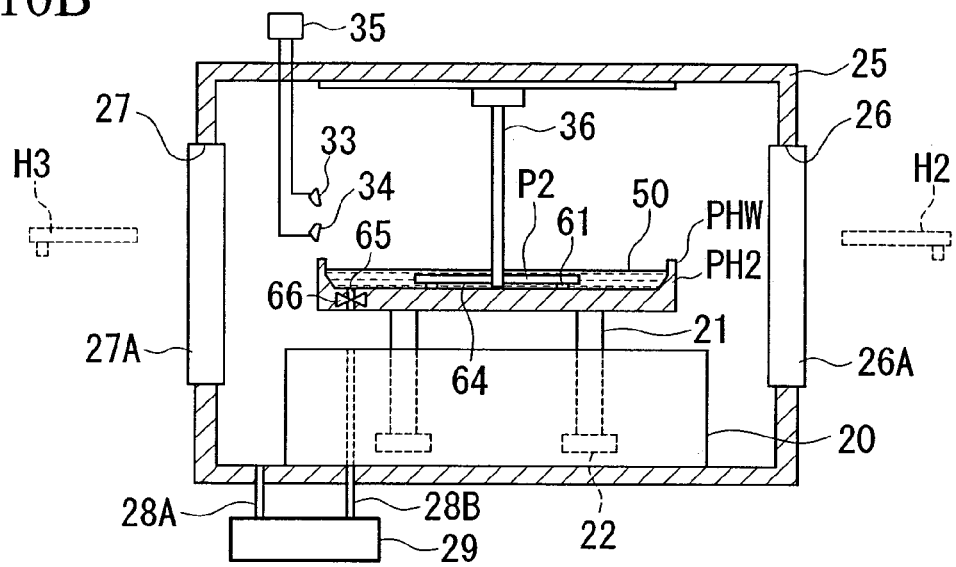

After delivering the substrate holder PH2 to the holder supporting members 21, the second conveyance device H2 retreats from the chamber 25 via the first opening portion 26. When the second conveyance device H2 has retreated from the chamber 25, the controller CONT closes the first shutter 26A, as shown in FIG. 10B. By this, the chamber 25 is made to be airtight. When the chamber 25 has made to be airtight, the controller CONT makes the under surface of the substrate P2 to be held by the end portions of the holding member 36. Here, with the substrate P2 being supported by the convex portions 61 of the substrate holder PH2, a space portion 64 is formed between the substrate P2 and the bottom surface portion PHT of the substrate holder PH2; and thus, the holding member 36 enters this space portion 64 to hold the under surface of the substrate P.

Figure 10C:
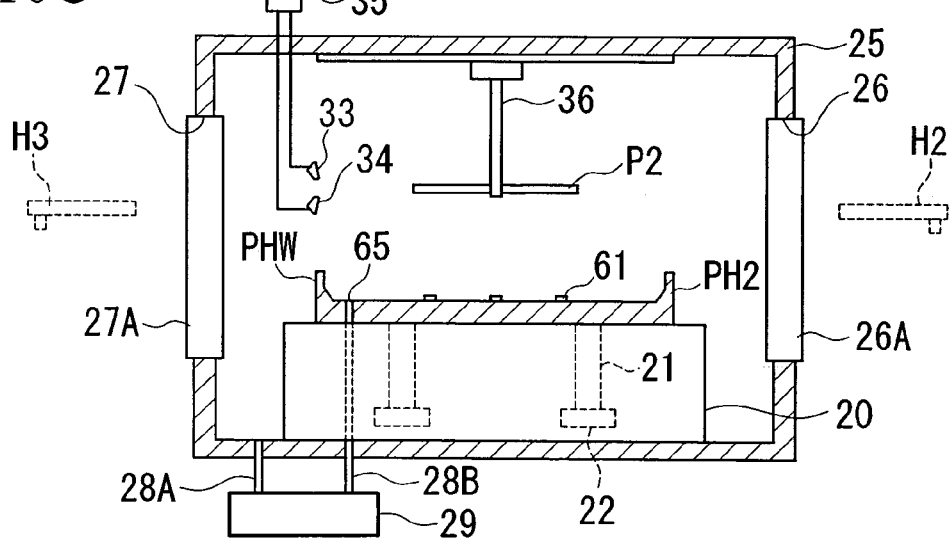

When the substrate P2 is held by the holding member 36, the controller CONT moves down the holder supporting members 21 by the driving mechanisms 22. By this, as shown in FIG. 10C, the substrate P2 held by the holding member 36 is detached from the substrate holder PH2. In this manner, the holding member 36 holds the substrate P2 on the substrate holder PH2 and detaches the substrate P2 from the substrate holder PH2, with the substrate holder PH2 being moved down. On the other hand, the holder supporting members 21 mount, on the upper surface of the stage device 20, the substrate holder PH2 that has moved down. With the substrate holder PH2 being mounted on the upper surface of the stage device 20, the suction pipe 28B of the stage device 20 is connected to the flow path 65 of the substrate holder PH2. When the suction pipe 28B is connected to the flow path 65, the controller CONT activates the valve portion 66 to open the flow path 65. By this, the liquid 50 kept inside of the side wall portion PHW of the substrate holder PH2 is sucked by and into the liquid suction device 29 via the flow path 65 and the suction pipe 28B.

On the other hand, the controller CONT drives the gas supply device 35 and makes dry air to be blown, via the first and second blowing portions 33 and 34, against the substrate P2 separated from the substrate holder PH2 and held by the holding member 36, and thus liquid 50 adhering on the substrate P2 is removed. While the liquid blown off from the substrate P2 drops onto the substrate holder PH2 and onto the bottom portion of the chamber 25, the liquid is recovered by and into the liquid suction device 29 via the suction pipe 28B and 28A, respectively. After completion of the liquid removal process using the first and second blowing portions 33 and 34, the liquid 50 that pooled inside of the side wall portion PHW of the substrate holder PH is sucked and recovered by and into the liquid suction device 29. Furthermore, after completion of the liquid removal process using the first and second blowing portions 33 and 34, the liquid 50 that has dropped around the stage device 20 (on the bottom of the chamber) is sucked and recovered by and into the liquid suction device 29 via the suction pipe 28A. The liquid suction device 29 recovers the liquid blown off from the substrate P2, by sucking the gas inside of the chamber 25 along with the liquid scattered. Here, the liquid suction device 29 continuously performs the sucking operation on the gas inside of the chamber 25 and the liquid scattered. By this, adhesion of the liquid onto the inner walls of the chamber 25 or onto the substrate holder PH2 is avoided. In addition, because liquid 50 does not stay inside of the chamber 25, e.g., on the inner walls or the bottom of the chamber 25, the humidity in the chamber 25 does not change considerably. Also, even when the shutter 26A and/or the shutter 27A are opened, wet gas in the chamber 25 would not flow out to the outside of the chamber 25. It is to be noted that it may also be configured such that by providing a drying device that can supply dry air into the chamber 25, dry air is supplied into the chamber 25 in parallel with the sucking operation by the liquid suction device 29.

On completion of the removal of the liquid adhering on the substrate P2, the controller CONT opens the second shutter 27A. When the second shutter 27A is opened, the third conveyance device H3 receives, via the second opening portion 27, the substrate P2 held by the holding member 36. The third conveyance device H3 holding the substrate P2 from which liquid 50 has been removed carries out the substrate P2 from the liquid removal device 100 (the inside of the chamber 25) via the second opening portion 27.

The substrate P2, from which the liquid has been removed by the liquid removal device 100 and which has been delivered to the third conveyance device H3, is conveyed to the coater-developer main body C/D via the interface portion IF. The substrate P2 delivered to the coater-developer main body C/D (development device D) is applied with a development process. In this manner, the exposure apparatus EX-SYS of the embodiment removes, before the substrate P is carried out into the coater-developer device C/D-SYS via the interface portion IF, the liquid adhering on the substrate P by means of the liquid removal device 100.

Next, the third conveyance device H3 delivers an unexposed substrate P3 (not shown) to the holding member 36 via the second opening portion 27 of the chamber 25. When the substrate P3 is held by the holding member 36, the controller CONT moves up the holder supporting members 21 and mounts the substrate P3 on the substrate holder PH2. When the substrate P3 is mounted on the substrate holder PH2, the controller CONT opens the first shutter 26A, carries out, by using the first conveyance device H1, the substrate holder PH2 holding the substrate P3 from the liquid removal device 100, and loads the substrate holder PH2 on the substrate stage PST2.

As described above, because the substrate P having experienced an exposure process can be carried out in a state that the substrate is held by the substrate holder PH, the ambient condition change, the rusting of the devices, etc., due to the dropping or scattering of the liquid can be prevented. Because the first and second conveyance devices H1 and H2 are configured such that they hold not the substrate P on which the liquid is adhering, but the substrate holder PH on which the liquid is not adhering, the conveyance devices are not exposed to the liquid, and thus the dropping or scattering of the liquid along the conveyance paths can be reliably prevented. Furthermore, with liquid 50 adhering on the substrate P being removed by the liquid removal device 100, the occurrence of disadvantages due to the dropping of the liquid during the conveyance processes of the substrate P, for example, the disadvantage that the humidity (ambient condition) in the first chamber device CH1 changes or the disadvantage various devices and members neighboring on the conveyance path rust can be precluded. Furthermore, because the third conveyance device H3 holds substrate P which is in a state that the liquid has been removed therefrom by the liquid removal device 100, the third conveyance device H3 can convey the substrate P, with the device not being exposed to the liquid. Furthermore, because it is configured such that before conveying substrate P that has been applied with an exposure process in the exposure apparatus main body EX to the coater-developer device C/D-SYS (development device D), liquid 50 adhering on the substrate P is removed by the liquid removal device 100, the influence of the liquid 50 on the development process can be eliminated.

Furthermore, in the embodiment, it is configured such that the liquid removal device 100 is provided midway along the conveyance path of the conveyance system H and that the exposure apparatus main body EX adopts a twin stage system. For this reason, while performing the liquid immersion exposure for the substrate P1 on the substrate stage PST1, one of the twin stages, the substrate holder PH2 located on the substrate stage PST2, the other twin stage, and holding the substrate P2 can be detached and carried out; and thus, the liquid immersion exposure process at the first substrate holder PH1 can be performed in parallel with the carrying out of the second substrate holder PH2 and with the liquid removal operation at the second substrate holder PH2. Thus, the overall process can be performed while improving the throughput. In addition, because the liquid removal process is performed inside of the chamber 25, scattering of liquid 50 into the surroundings can prevented.

It should be noted that while, in the above-described embodiment, after the substrate stage PST1 (PST2) has moved under the projection optical system PL, the supply of liquid 50 to the inside of the side wall portion PHW of the substrate holder PH by means of the liquid supply mechanism 12 is initiated, it may also be configured such that another liquid supply mechanism is disposed near the position where the substrate holder PH is loaded on the substrate stage PST1 (PST2) or the position where the measurement by means of the alignment system AL is performed, and, while one substrate stage (PST1) is performing an exposure operation, liquid (purified water) having the same temperature as the liquid supplied from the liquid supply mechanism 12 is supplied to inside of the side wall PHW of the substrate holder PH mounted on the other substrate stage PST2 to immerse the substrate P on the substrate stage PST2 in the liquid. In this case, the measurement by the alignment system AL may be performed either before the substrate P on the substrate stage PST2 is immersed in the liquid or after the substrate has been immersed in the liquid. However, in the case of performing the measurement with the substrate P being immersed in the liquid, the alignment system AL is required to be adapted to the liquid immersion method. By, in this way, immersing the substrate P in the liquid before the substrate stage PST moves under the projection optical system PL, the throughput can be improved, and, at the same time, the exposure of the substrate P can be immediately initiated in a state that the temperature of the substrate P is stabilized.

Furthermore, it may also be configured such that by making at least one of the optical element 60 of the projection optical system PL and the substrate holder PH (PH1, PH2) on the substrate stage PST (PST1, PST2) movable in the Z-direction, at least one of the optical element 60 and the substrate holder PH is moved in the Z-direction during the movement of the substrate stage PST so that the upper end portion of the side wall portion PHW of the substrate holder PH does not collide with the end portion of the projection optical system PL.

Furthermore, if there is the possibility that during the movement of the substrate stage PST, the liquid inside of the side wall portion PHW of the substrate holder PH vibrates due to the movement of the substrate stage PST, it may be configured such that an anti-turbulence material is disposed on the inside surface of the side wall portion PHW of the substrate holder PH to prevent scattering of the liquid.

It is to be noted that while, in the above embodiment, when blowing off the liquid adhering on substrate P in the liquid removal device 100, dry air is blown against the substrate P in a state that the substrate is held parallel to the horizontal plane (XY-plane), the dry air may also be blown against substrate P in a state that the substrate is inclined relative to the horizontal plane. By this configuration, the liquid 50 adhering on the substrate P leaves the substrate P more easily owing to its own weight of the liquid. Of course, the dry air may also be blown against the substrate P in a state that the substrate is set to be vertical.

In the above-described embodiment, the substrate holder PH is provided with the side wall portion PHW; however, when liquid immersion exposure is performed by forming a liquid immersion region on a part of the substrate P as described in PCT International Publication No. WO 99/49504, the side wall portion PHW may be dispensed with. Because, in that case also, the substrate P is carried out with the substrate being still held by the substrate holder PH, dropping of the liquid from the substrate P can be prevented, for example.

Furthermore, while in the above-described embodiment, the description is made by using the two substrate holders PH, three or more substrate holders may also be used.

It is to be noted that while the above-described embodiment adopts the twin stage system using the two substrate stages PST1 and PST2, the present invention can, of course, be applied to an exposure apparatus having a single substrate stage PST.

As described above, the liquid 50 of the embodiments is constituted by purified water. Purified water has the advantage that it is easily available in bulk in, e.g., semiconductor manufacturing factories and also the advantage that it does not adversely affect photoresist on substrate P1 optical elements (lenses), etc. Furthermore, purified water does not adversely affect the environment and contains scarcely any impurities; thus, the effect that it cleans the surface of the substrate P and the surface of the optical element provided at the end portion of the projection optical system PL can be expected.

Furthermore, the refractive index n of purified water (water) relative to the exposure light EL having a wavelength of about 193 nm is approximately 1.44, and thus, when ArF excimer laser light (having 193 nm wavelength) is used as the light source of the exposure light EL, the wavelength is effectively shortened, on substrate P, as multiplied by 1/n, i.e., effectively becomes approximately 134 nm, and a high resolution can be obtained. Furthermore, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased, which also improves the resolution.

While, in the embodiment, the optical element 60 is attached to the end portion of the projection optical system PL, an optical plate for adjusting the optical characteristics, e.g., aberrations (spherical aberration, coma aberration, etc.), of the projection optical system PL may be utilized as the optical element to be attached to the end portion of the projection optical system PL. Alternatively, a plane parallel plate that can transmit the exposure light EL may be utilized.

It should be noted that if the pressure, caused by the flow of liquid 50, of the space between the optical element located at the end portion of the projection optical system PL and substrate P is high, it may be configured such that the optical element is rigidly fixed so as not to move due to the pressure, instead of making the optical element replaceable.

It should be noted that while, in the embodiment, it is configured such that the space between the projection optical system PL and the surface of substrate P is filled with liquid 50, it may also be configured, for example, such that the space is filled with the liquid 50 in the condition that a cover glass constituted by a plane parallel plate is attached to the surface of the substrate P.

It should be noted that in the above-described embodiment, the configuration of the nozzles is not exclusively restricted to that described earlier, and it may be configured, for example, such that with respect to the long side of the end portion 60A, liquid 50 is supplied and recovered by two pairs of nozzles. Note that, in this case, supply nozzles and recovery nozzles may be arranged one above the other so that liquid 50 can be supplied and recovered from both of the +X and −X directions.

It should be noted that while, in the above-described embodiment, it is configured such that by blowing a gas (dry air) against substrate P, the liquid removal device 100 removes the liquid adhering on the substrate P, it may also be configured such that by sucking the liquid adhering on the upper and reverse surfaces of the substrate P detached from the substrate holder PH, the liquid is removed. This will be described referring to FIG. 11. Note that in the following description, the same or equivalent constituent elements as those in the above-described embodiment are denoted by the same reference numerals, and their descriptions will be abridged or omitted.

Figure 11:
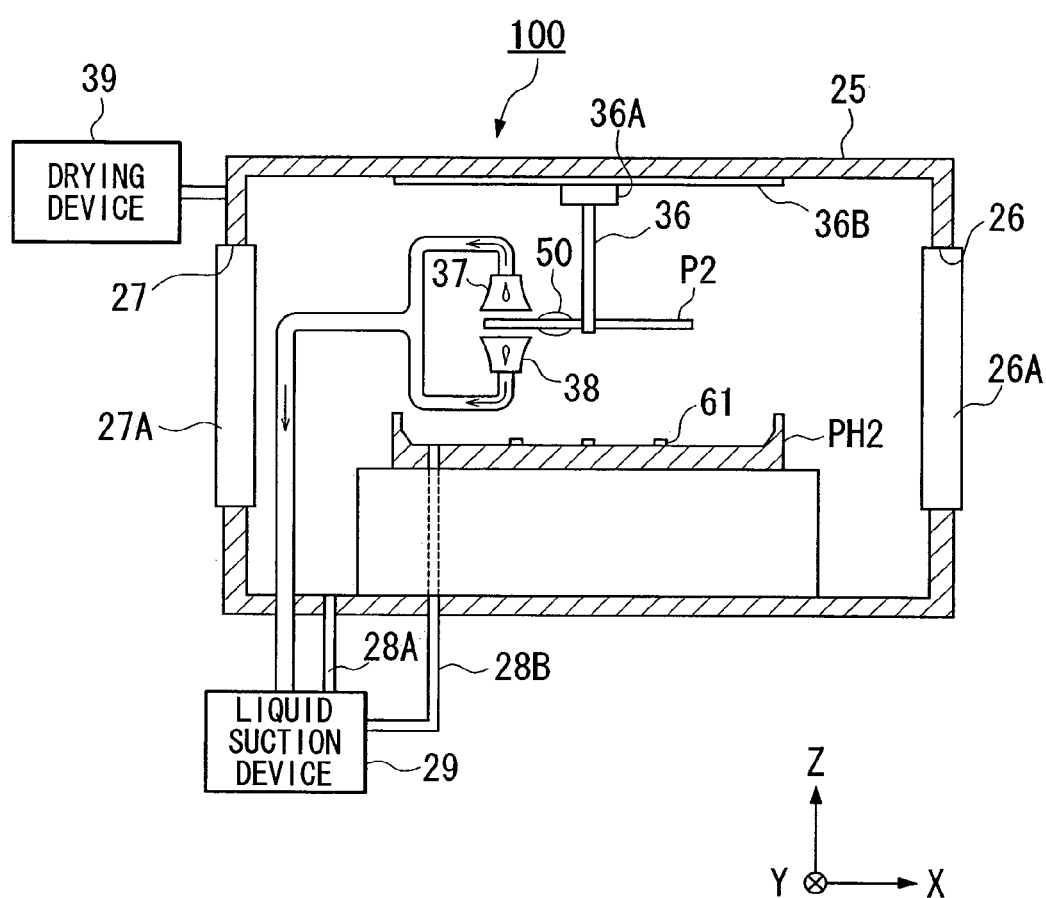
FIG. 11 is schematic diagram showing another embodiment of a liquid removal device associated with the present invention.

The liquid removal device 100 shown in FIG. 11 is provided with first and second suction portions 37 and 38 that are connected to the liquid suction device 29 via a flow path and suck liquid 50 adhering on the upper surface and reverse surface of the substrate P2, respectively, and with a drying device 39 that dries the inside of the chamber 25. The first and second suction portions 37 and 38 are provided such that they are movable in the X-direction relative to the substrate P2. When removing the liquid 50 adhering on the substrate P2, the controller CONT drives the liquid suction device 29 in a state that the first and second suction portions 37 and 38 are made to be near the substrate P2. By this, the liquid 50 adhering on the substrate P2 is sucked by and into the liquid suction device 29 via the first and second suction portions 37 and 38. By performing the sucking operation by the liquid suction device 29 while moving the first and second suction portions 37 and 38 in the X-direction relative to the substrate P2, the liquid 50 adhering on the substrate P2 is removed. During this process, the drying device 39 supplies a dry gas (dry air) to the inside of the chamber 25. With the inside of the chamber 25 being dried by the drive of the drying device 39, the removal of the liquid 50 from the substrate P2 can be facilitated.

It is to be noted that it may also be configured such that the sucking operation to suck the liquid 50 on the substrate P2 described referring to FIG. 11 and the gas blowing operation through the blowing portions described referring to FIG. 8, etc., are simultaneously performed. Alternatively, it may be configured such that after performing either one of the sucking operation and the gas blowing operation, the other operation is performed. Furthermore, the drying operation by the drying device 39 may be performed in parallel with the sucking operation and/or the gas blowing operation or may be performed before and/or after those operations. In other words, any appropriate combination of the sucking operation, the drying operation, and the gas blowing operation (liquid blowing off operation) may be used.

It should be noted that for the exposure process performed, based on a liquid immersion method, in the exposure apparatus main body EX, a liquid other than water may be used as liquid 50. For example, when the light source of the exposure light EL is an $F_2$ laser, the $F_2$ laser light does not transmit through water, and thus by using, as liquid 50, a fluorochemical oil that can transmit the $F_2$ laser light, the exposure process can be realized. As just described, a liquid other than water may be used as liquid 50. Furthermore, as liquid 50, a material, e.g., cedar oil, that can transmit the exposure light EL, has a high refractive index as high as practicable, and does not affect projection optical system and the photoresist applied to the surface of substrate P can also be used.

It is to noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc., can be used.

Regarding the exposure apparatus (exposure apparatus main body) EX, in addition to a scan type exposure apparatus (scanning stepper) in which while synchronously moving mask M and substrate P, the pattern of the mask M is scan-exposed, a step-and-repeat type projection exposure apparatus (stepper) in which the pattern of mask M is exposed at one time in the condition that the mask M and the substrate P are stationary, and the substrate P is successively moved stepwise can be used. Also, the present invention can be applied to a step-and-stitch type exposure apparatus in which at least two patterns are transferred onto substrate P in a partially overlapping manner.

Regarding the type of the exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or displays, an exposure apparatus for manufacturing thin film magnetic heads, an exposure apparatus for manufacturing image pickup devices, and an exposure apparatus for manufacturing reticles or masks.

When using a linear motor (see U.S. Pat. Nos. 5,623,853 or 5,528,118) for the substrate stage PST or the mask stage MST, either air-cushion type linear motor using an air bearing or a magnetic levitation type linear motor using a Lorentz force or reactance force may be used. Furthermore, each of the substrate stage PST and the mask stage MST may be either of a type moving along a guide or of a guideless type having no guide.

As the driving mechanism for each of the substrate stage PST and the mask stage MST, a planar motor in which by making a magnet unit in which magnets are two-dimensionally arranged and an armature unit in which coils are two-dimensionally arranged face each other, each of the substrate stage PST and the mask stage MST is driven by an electromagnetic force may be used. In this case, either one of the magnet unit and the armature unit is attached to the stage PST or the stage MST, and the other unit is attached to the moving surface side of the stage PST or the stage MST.

A reaction force generated by the movement of the substrate stage PST may be, as described in Japanese Unexamined Patent Application, First Publication No. H08-166475 (U.S. Pat. No. 5,528,118), mechanically released to the floor (earth) by use of a frame member so that the force does not transmit to the projection optical system PL. A reaction force generated by the movement of the mask stage MST may be, as described in Japanese Unexamined Patent Application, First Publication No. H08-330224 (U.S. patent application Ser. No. 08/416,558), mechanically released to the floor (earth) by use of a frame member so that the force does not transmit to the projection optical system PL.

As described above, the exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc., are controlled.

Figure 12:
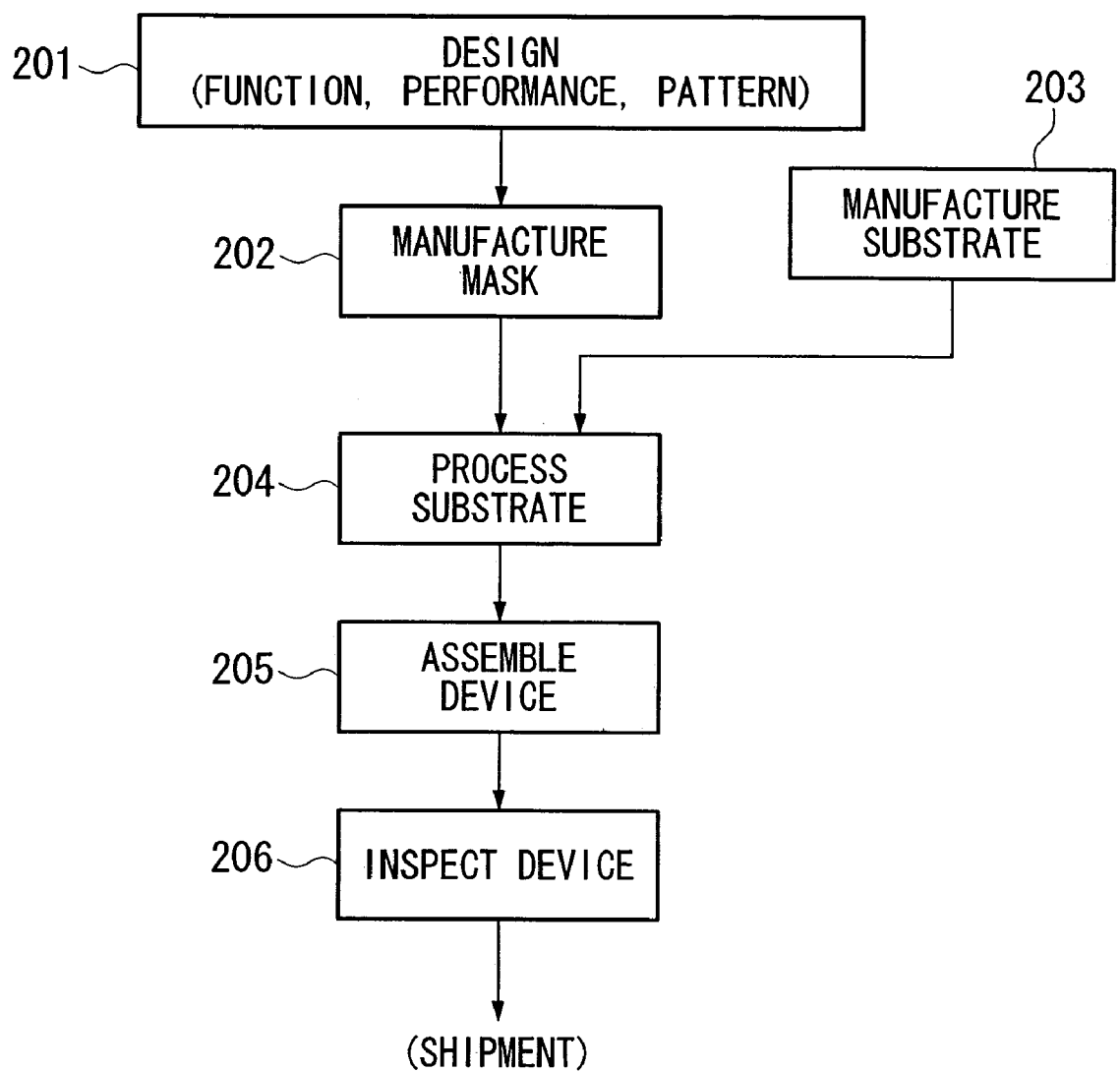
FIG. 12 is a flowchart showing an example of a semiconductor device manufacturing process.

As shown in FIG. 12, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; step 204 in which the mask pattern is exposed onto the substrate by exposure apparatus EX according to the above-described embodiments; device assembly step 205 (including the dicing process, bonding process, and packaging process); inspection step 206.

In accordance with the present invention, since the influence of the vaporization of liquid on a substrate and the influence of impurities can be suppressed, and, at the same time, the dropping or scattering of the liquid from the substrate during its conveyance process can be prevented, the ambient condition change, the rusting of the devices, etc., are prevented, and thus, desired patterns can be formed on the substrate with high accuracy.

What is claimed is:

1. An exposure apparatus in which by projecting an image of a pattern onto a substrate, the substrate is exposed, the exposure apparatus comprising:
   a projection optical system having an optical member, the image being projected onto the substrate through a liquid between the optical member and the substrate opposite to the optical member;
   a substrate holding member that holds the substrate and keeps the liquid so that the substrate is immersed in the liquid;
   a liquid supply system that supplies, at a vicinity of a projection area of the projection optical system, the liquid onto the substrate from above the substrate held by the substrate holding member; and
   a movable member that supports the substrate holding member and that moves the substrate holding member, wherein
   the substrate held by the substrate holding member is moved during the exposure relative to the optical member while a space between the optical member and the substrate is filled with the liquid,
   the substrate holding member is attachable to the movable member in a state in which the substrate is held by the substrate holding member, and
   after the substrate holding member is attached to the movable member, liquid is supplied.

2. An exposure apparatus according to claim 1, further comprising: a liquid recovery system that recovers, at a vicinity of the projection area, the liquid on the substrate.

3. An exposure apparatus according to claim 1, wherein the substrate holding member is detachable from the movable member.

4. An exposure apparatus in which by projecting an image of a pattern onto a substrate, the substrate is exposed, the exposure apparatus comprising:
   a projection optical system having an optical member, the image being projected onto the substrate through a liquid between the optical member and the substrate opposite to the optical member;
   a substrate holding member that holds the substrate and has a side wall portion formed such that the side wall portion surrounds the substrate to prevent flowing out of the liquid; and
   a movable member on which the substrate holding member can be detachably held and which is movable relative to the projection optical system while supporting the substrate holding member, wherein
   the substrate held by the substrate holding member is moved during the exposure relative to the optical member while a space between the optical member and the substrate is filled with the liquid,
   the substrate holding member is attachable to and detachable from the movable member in a state in which the substrate is held by the substrate holding member, and
   after the substrate holding member is attached to the movable member, the liquid is supplied.

5. An exposure apparatus according to claim 4, further comprising: a liquid removal system that removes, after the substrate holding member is detached from the movable member, the liquid on the substrate after the substrate has been exposed.

6. An exposure apparatus according to claim 5, wherein
   the movable member has a first movable member and a second movable member,
   the substrate holding member has a plurality of substrate holding members that are attachable to and detachable from any one of the first and second movable members, and
   during the liquid immersion exposure of a substrate on a first one of the substrate holding members supported by one of the first and second movable members, a second one of the substrate holding members is detached and unloaded from the other of the first and second movable members.

7. An exposure apparatus in which by projecting an image of a pattern onto a substrate, the substrate is exposed, the exposure apparatus comprising:
   a projection optical system having an optical member, the image being projected onto the substrate through a liquid between the optical member and the substrate opposite to the optical member;
   a substrate holding member that holds the substrate;
   a movable member on which the substrate holding member can be detachably held and which is movable relative to the projection optical system while supporting the substrate holding member, the movable member moving the substrate held by the substrate holding member during the exposure relative to the optical member while a space between the optical member and the substrate is filled with the liquid;
   a conveyance system that conveys the substrate holding member after being detached from the movable member, with the substrate being still held by the substrate holding member; and
   a liquid removal system that removes, after the substrate holding member is detached from the movable member, the liquid on the substrate after the substrate has been exposed.

8. An exposure apparatus according to claim 7, wherein
   the movable member has a first movable member and a second movable member,
   the substrate holding member has a plurality of substrate holding members that are attachable to and detachable from any one of the first and second movable members, and
   during the liquid immersion exposure of a substrate on a first one of the substrate holding members supported by one of the first and second movable members, a second one of the substrate holding members is detached and unloaded from the other of the first and second movable members.

9. A method of manufacturing a device, the method comprising:
   exposing a substrate by utilizing the exposure apparatus of claim 1; and
   developing the exposed substrate.

10. A method of manufacturing a device, the method comprising:
    exposing a substrate by utilizing the exposure apparatus of claim 4; and
    developing the exposed substrate.

11. A method of manufacturing a device, the method comprising:
    exposing a substrate by utilizing the exposure apparatus of claim 7; and
    developing the exposed substrate.

12. A liquid immersion exposure apparatus comprising:
an optical member through which a substrate is exposed with an exposure beam;
a first holding member by which the substrate is held;
a movable member that detachably holds the first holding member;
a liquid supply system having a liquid supply outlet to supply a liquid; and
a conveyance device that conveys the first holding member with the substrate being held by the first holding member, wherein
the substrate held by the first holding member is moved during the exposure relative to the optical member using the movable member while a space between the optical member and the substrate is filled with the liquid, and
the liquid supply by the liquid supply system starts after the first holding member is attached to the movable member with the substrate being held by the first holding member.

13. An apparatus according to claim 12, wherein the liquid supply system supplies the liquid from above the substrate held by the first holding member.

14. An apparatus according to claim 12, wherein the first holding member has a liquid retaining portion to retain the liquid so that the entire surface of the substrate held by the first holding member is substantially immersed.

15. An apparatus according to claim 14, wherein the conveyance device conveys the first holding member detached from the movable member with the exposed substrate being held by the first holding member, while retaining the liquid by the first holding member.

16. An apparatus according to claim 15, further comprising a second holding member by which a substrate is held, and wherein during the conveyance of the first holding member by the conveyance device, the substrate held by the second holding member is exposed to the exposure beam through the optical member.

17. An apparatus according to claim 12, wherein the first holding member has a liquid retaining portion to retain the liquid, and wherein the conveyance device conveys the first holding member detached from the movable member with the exposed substrate being held by the first holding member, while retaining the liquid by the first holding member.

18. An apparatus according to claim 17, further comprising a second holding member by which a substrate is held, and wherein during the conveyance of the first holding member by the conveyance device, the substrate held by the second holding member is exposed with the exposure beam through the optical member.

19. An apparatus according to claim 17, further comprising a liquid discharge system that discharges the liquid from the first holding member after the first holding member is detached from the movable member with the exposed substrate and the liquid.

20. An apparatus according to claim 17, further comprising a liquid removal system that removes the liquid from the substrate after the first holding member is detached from the movable member with the exposed substrate and the liquid.

21. An apparatus according to claim 20, wherein the liquid removal system removes the liquid from the substrate after the substrate is released from the first holding member.

22. An apparatus according to claim 12, further comprising a measurement system that obtains positional information of the substrate held by the first holding member, and the liquid supply by the liquid supply system starts after finishing the measurement by the measurement system.

23. An apparatus according to claim 22, wherein the first holding member has a liquid retaining portion to retain the liquid, and wherein the conveyance device conveys the first holding member detached from the movable member with the exposed substrate being held by the first holding member, while retaining the liquid by the first holding member.

24. An apparatus according to claim 23, further comprising a second holding member by which a substrate is held, and wherein during the conveyance of the first holding member by the conveyance device, the substrate held by the second holding member is exposed to the exposure beam through the optical member.

25. An apparatus according to claim 12, wherein the liquid supply system supplies the liquid during the exposure of the substrate.

26. An apparatus according to claim 25, further comprising a liquid recovery system that recovers the liquid on the substrate during the exposure.

27. An apparatus according to claim 26, further comprising a liquid discharge system that discharges the liquid from the first holding member, wherein the conveyance device conveys the first holding member with the exposed substrate and the liquid, and the liquid discharge system discharges the liquid from the first holding member after the first holding member is detached from the movable member with the exposed substrate and the liquid.

28. An apparatus according to claim 25, wherein the first holding member has a liquid retaining portion to retain the liquid, and wherein the conveyance device conveys the first holding member detached from the movable member with the exposed substrate being held by the first holding member, while retaining the liquid by the first holding member.

29. An apparatus according to claim 28, further comprising a second holding member by which a substrate is held, and wherein during the conveyance of the first holding member by the conveyance device, the substrate held by the second holding member is exposed to the exposure beam through the optical member.

30. A liquid immersion exposure method comprising:
holding a substrate by a holding member;
attaching the holding member to a movable member with the substrate being held by the holding member; and
exposing the substrate held by the holding member with an exposure beam through a liquid between an optical member and the substrate, while moving the substrate relative to the optical member using the movable member, wherein
the liquid is supplied after the holding member is attached to the movable member with the substrate being held by the holding member.

31. A method according to claim 30 wherein the entire surface of the substrate held by the holding member is substantially immersed in the supplied liquid.

32. A method according to claim 31, further comprising:
conveying the holding member detached from the movable member with the exposed substrate being held by the holding member, while retaining the liquid by the holding member.

33. A method according to claim 30, further comprising:
conveying the holding member detached from the movable member with the exposed substrate being held by the holding member, while retaining the liquid by the holding member.

34. A method according to claim 33, further comprising:
discharging the liquid from the holding member after the holding member is detached from the movable member with the exposed substrate and the liquid.

35. A method according to claim 33, further comprising:
removing the liquid from the exposed substrate after the holding member is detached from the movable member with the exposed substrate and the liquid.

36. A method according to claim 35, further comprising:
releasing the exposed substrate from the holding member after the holding member is detached from the movable member with the exposed substrate and the liquid, and wherein the liquid removal is performed after the exposed substrate is released from the holding member.

37. A method according to claim 30, further comprising:
obtaining positional information of the substrate held by the holding member using a measurement system after the holding member is attached to the movable member, and wherein the liquid is supplied after obtaining the positional information, and the exposure of the substrate is performed using the positional information.

38. A method according to claim 37, further comprising:
conveying the holding member detached from the movable member with the exposed substrate being held by the holding member, while retaining the liquid by the holding member.

39. A method according to claim 38, further comprising:
discharging the liquid from the holding member after the holding member is detached from the movable member with the exposed substrate and the liquid.

40. A method according to claim 38, further comprising:
removing the liquid from the substrate after the holding member is detached from the movable member with the exposed substrate and the liquid.

41. A method according to claim 40, further comprising:
releasing the substrate from the holding member after the holding member is detached from the movable member with the exposed substrate and the liquid, and wherein the liquid removal is performed after the substrate is released from the holding member.

42. A method according to claim 37, further comprising:
supplying the liquid during the exposure of the substrate.

43. A method according to claim 30, further comprising:
supplying the liquid during the exposure of the substrate.

44. A method according to claim 43, further comprising:
recovering the liquid on the substrate during the exposure.

45. A method according to claim 44, further comprising:
conveying the holding member detached from the movable member with the exposed substrate being held by the holding member, while retaining the liquid by the holding member; and
discharging the liquid from the holding member after the holding member is detached from the movable member.

46. A method according to claim 45, further comprising:
removing the liquid from the substrate after the holding member is detached from the movable member.

47. A method according to claim 46, further comprising:
releasing the substrate from the holding member after the holding member is detached from the moving member, and wherein the liquid removal is performed after the substrate is released from the holding member.

48. A device manufacturing method comprising:
holding a substrate by a holding member;
attaching the holding member to a movable member with the substrate being held by the holding member;
exposing the substrate held by the holding member with an exposure beam through a liquid between an optical member and the substrate, while moving the substrate relative to the optical member using the movable member; and
processing the exposed substrate, wherein
the liquid is supplied after the holding member is attached to the movable member with the substrate being held by the holding member.

49. A method according to claim 48, further comprising:
conveying the holding member detached from the movable member with the exposed substrate being held by the holding member, while retaining the liquid by the holding member.

50. A method according to claim 49, further comprising:
removing the liquid from the exposed substrate after the holding member is detached from the movable member with the exposed substrate and the liquid.

51. A method according to claim 50, further comprising:
releasing the exposed substrate from the holding member after the holding member is detached from the movable member with the exposed substrate and the liquid, and wherein the liquid removal is performed after the exposed substrate is released from the holding member.

52. A method according to claim 50, wherein the liquid removal is performed before the exposed substrate is conveyed from an exposure apparatus to a developing apparatus.

53. A method according to claim 52, wherein the exposure apparatus and the developing apparatus are connected with each other via an interface section.

54. A method for making a liquid immersion exposure apparatus comprising:
providing an optical member through which a substrate is exposed to an exposure beam;
providing a holding member by which the substrate is held;
providing a movable member that attachably and detachably holds the holding member;
providing a liquid supply system having a liquid supply outlet to supply a liquid; and
supplying the liquid after the holding member is held by the movable member.
wherein the substrate held by the holding member is moved during the exposure relative to the optical member using the movable member while a space between the optical member and the substrate is filled with the liquid.

* * * * *